United States Patent [19]
Froeschle

[11] Patent Number: 5,345,165
[45] Date of Patent: Sep. 6, 1994

[54] FREQUENCY-STABILIZED TWO-STATE MODULATION USING HYSTERESIS CONTROL

[75] Inventor: Thomas A. Froeschle, Southborough, Mass.

[73] Assignee: Bose Corporation, Framingham, Mass.

[21] Appl. No.: 568,532

[22] Filed: Aug. 15, 1990

Related U.S. Application Data

[63] Continuation of Ser. No. 104,558, Sep. 30, 1987, abandoned, which is a continuation of Ser. No. 667,830, Nov. 2, 1984, abandoned.

[51] Int. Cl.$^5$ .............................................. G05F 1/59
[52] U.S. Cl. .................................... 323/284; 323/286; 330/10; 330/207 A; 363/21
[58] Field of Search .............. 323/222, 286, 267, 271, 323/284; 363/41, 21, 98; 330/10, 207 A, 251; 381/121

[56] References Cited

U.S. PATENT DOCUMENTS

| | | | |
|---|---|---|---|
| 3,182,268 | 5/1965 | Burwen | 330/10 |
| 3,294,981 | 12/1966 | Bose | 323/271 |
| 3,660,753 | 5/1972 | Judd . | |
| 3,988,694 | 10/1976 | Yamazaki | 330/207 P |
| 4,015,213 | 3/1977 | Hamada | 330/10 |
| 4,041,411 | 8/1977 | Sturgeon | 330/207 A |
| 4,043,890 | 8/1977 | Eckerle | 330/10 |
| 4,392,103 | 7/1983 | O'Sullivan | 323/222 |
| 4,433,256 | 2/1984 | Dolikian | 307/358 |
| 4,456,872 | 6/1984 | Froeschle | 323/286 |
| 4,467,262 | 8/1984 | Curtiss | 318/811 |
| 4,469,997 | 9/1984 | Curtiss et al. | 318/729 |
| 4,529,927 | 7/1985 | Sullivan et al. | 323/222 |
| 4,535,294 | 8/1985 | Ericksen et al. | 307/358 |
| 4,929,882 | 5/1990 | Szepesi | 323/222 |

FOREIGN PATENT DOCUMENTS

| | | |
|---|---|---|
| 90237 | 10/1983 | European Pat. Off. ............ 323/222 |
| WO82/02294 | 7/1982 | World Int. Prop. O. . |

OTHER PUBLICATIONS

Patent Abstracts of Japan, vol. 1, No. 21 (E-76), Mar. 25,1977, p. 849 E 76; & JP-A-51 120 157 cited therein.

*Primary Examiner*—William H. Beha, Jr.
*Attorney, Agent, or Firm*—Fish & Richardson

[57] ABSTRACT

A two-state modulation system includes a hysteretic comparator with variable thresholds, a two-state processor and an integrating element. A summing circuit combines a signal coupled from the output of the two-state processor, the signal output, the signal input and a delay compensating signal feedback input and a feedback input from an integrating element at the output of the two-state processor. The hysteretic comparator receives a hysteresis control signal that varies the threshold. The hysteresis control signal may be provided by analog switches switched by the switching signal to provide the switched two-state levels to a low pass filter. Rectifying circuitry may also be used for supplying the hysteresis control signal. Limiters and compressors may be connected to the input with the limiter limiting levels tracking the two-state levels, and the compression proportional to the switching frequency.

2 Claims, 31 Drawing Sheets

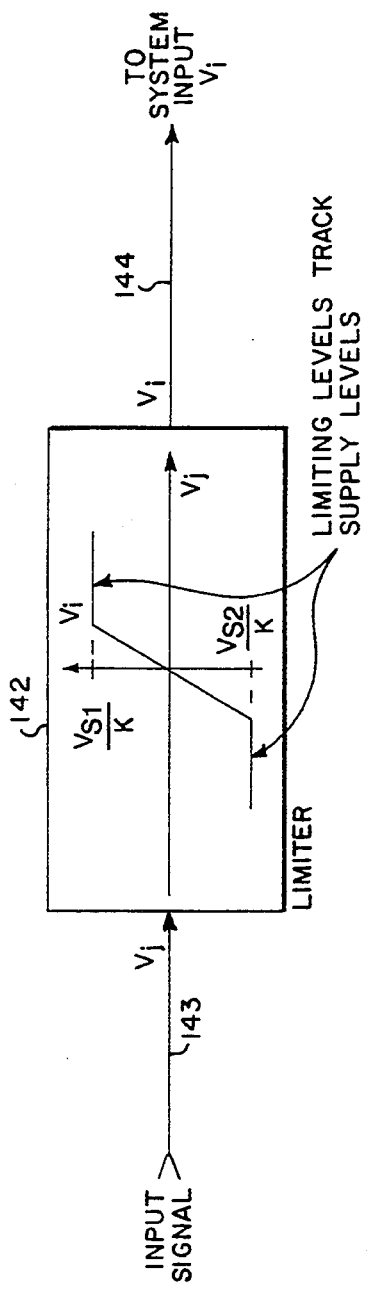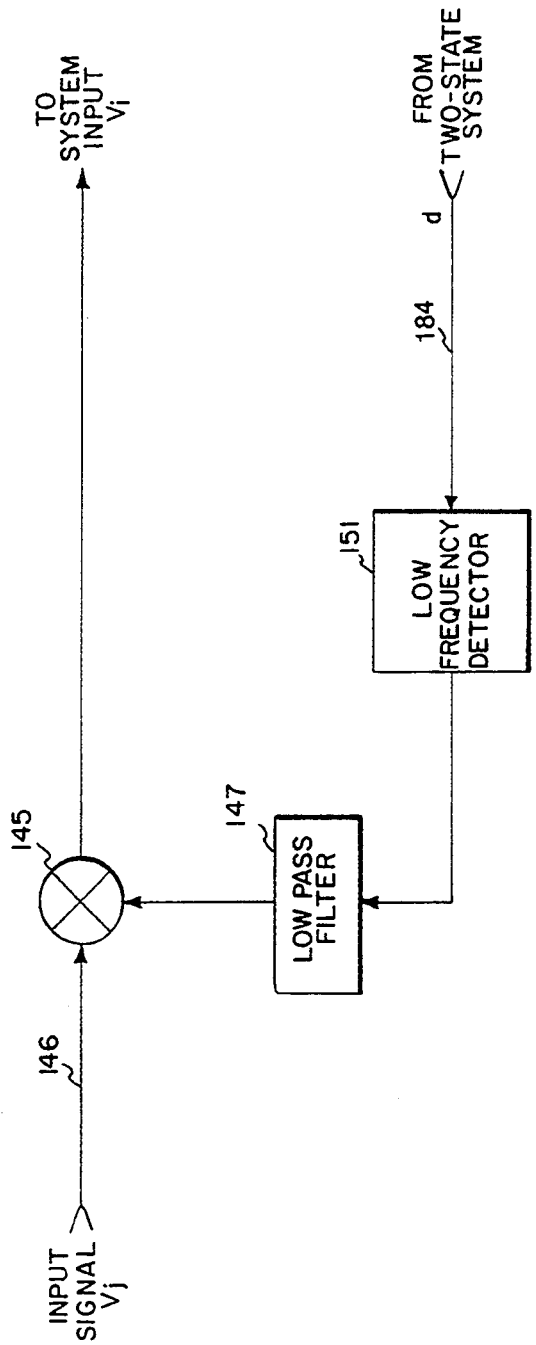

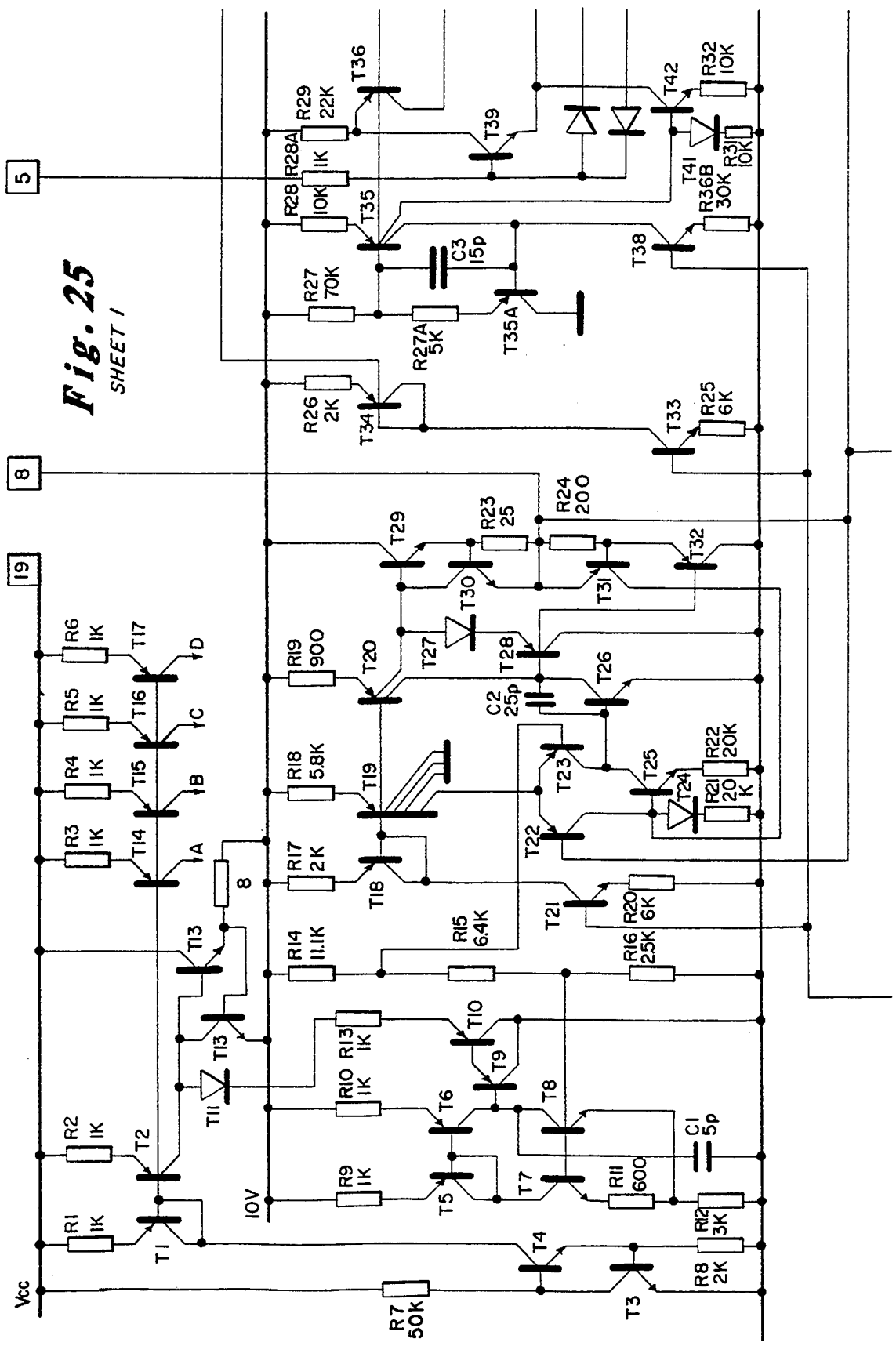
Fig. 25 SHEET 1

SHEET 2

SHEET 3

SHEET 4

SHEET 5

SHEET 6

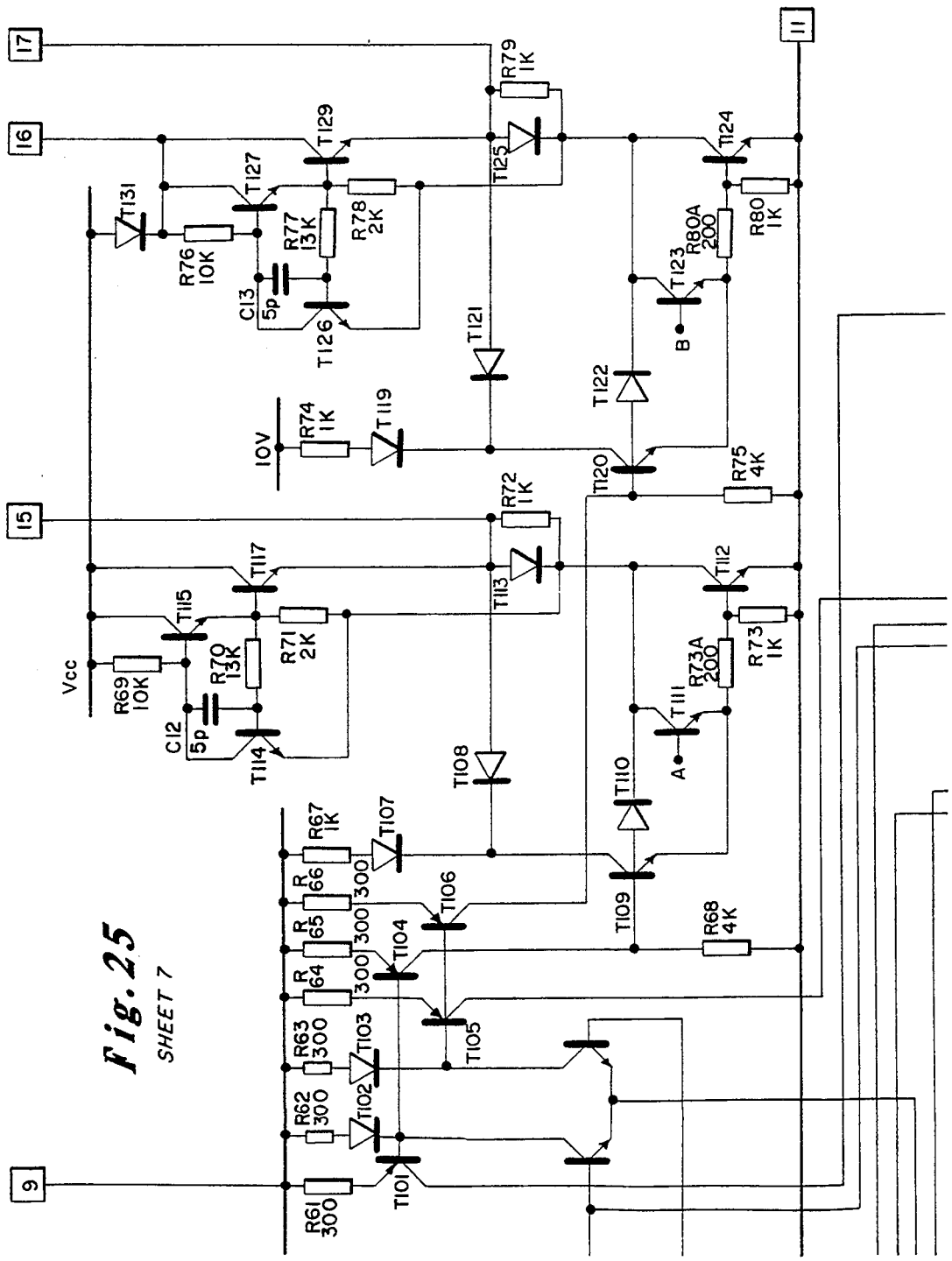
Fig. 25 SHEET 7

SHEET 8

SHEET 1

SHEET 2

SHEET 3

SHEET 3A

SHEET 4

FREQUENCY-STABILIZED TWO-STATE MODULATION USING HYSTERESIS CONTROL

This continuing application is a division of abandoned application Ser. No. 07/104,558 filed Sep. 30, 1987, which is a continuing application of abandoned application Ser. No. 06/667,830 filed Nov. 2, 1984.

The present invention relates in general to two-state modulation (TSM) and more particularly concerns novel apparatus and techniques for maintaining the switching frequency of a two-state modulation system substantially constant.

Two-state modulation has a number of advantages, especially for processing power at high levels with great efficiency. The basic patent on two-state modulation is U.S. Pat. No. 3,294,981 of Amar B. Bose, granted Dec. 27, 1966, for SIGNAL TRANSLATION EMPLOYING TWO-STATE TECHNIQUES. An improvement over this patented system is current-controlled two-state modulation (CCTSM) disclosed in U.S. Pat. No. 4,456,872, granted Jun. 26, 1984. In typical two-state modulation systems output power semiconductor switches turn on and off at a rate significantly higher than the highest frequencies of interest in a desired output signal with a ratio of on time to off time establishing an average value over a switching cycle representative of the amplitude of the desired output signal at that time. The instants of switching are related to a feedback signal derived from the output. Typically, the switching frequency may vary with duty cycle, especially at high levels of modulation. While fixed frequency pulses may be injected into the feedback loop to maintain the switching frequency nearly constant, a demand for high level modulation, such as a sudden shift in the level of the desired output signal, may cause switching frequency to change, even in the presence of clock pulses.

In some applications it is desirable to have a switching frequency substantially constant. For example, it may be easier to reduce radio frequency interference if the switching frequency remains constant. Another advantage of keeping the switching frequency constant is that the spectrum of alias signal s due to frequency modulation can be confined to higher frequencies. In audio amplifiers this characteristic is especially advantageous because otherwise high ripple voltages are developed on the load and audible alias signals develop at high modulation levels.

The stabilized systems can operate at a lower switching frequency without producing alias signals. Normally alias signals limit the allowable feedback loop gain because these signals overload the system if gain is excessive. The stabilized frequency permits the use of higher feedback loop gain. Consequently, performance is improved with respect to output impedance, distortion and frequency response. The stabilized frequency modulation system is optimum, allowing the highest loop gain due to the property of TSM and CCTSM (feedback of switching signals with little attenuation) and due to the frequency stabilization (prevention of interference by alias signals).

Frequency stabilization allows switching systems to operate in close proximity without mutual interference. Frequency stabilized systems may operate near digital circuits without interaction. The frequency stabilized system is much easier to synchronize to an external frequency reference.

Accordingly, it is an important object of this invention to provide an improved frequency-stabilized two-state modulation system.

According to the invention, in a two-state modulation system the improvement resides in means for establishing variable switching thresholds in dependence on signals obtained by processing other signals in the two-state modulation system. According to one aspect of the invention there is delay compensation means for providing a signal for compensating for delay in the signal processing.

Numerous other features objects and advantages of the invention will become apparent from the following specification when read in connection with the accompanying drawing in which:

FIG. 19 shows a block diagram illustrating the logical arrangement of a preferred form of limiter;

FIG. 20 shows a block diagram illustrating the logical arrangement of another technique for controlling high level signal conditions in an input signal applied to the two-state modulation system;

The same reference symbols identify corresponding elements throughout the drawing where appropriate.

Figure 1:
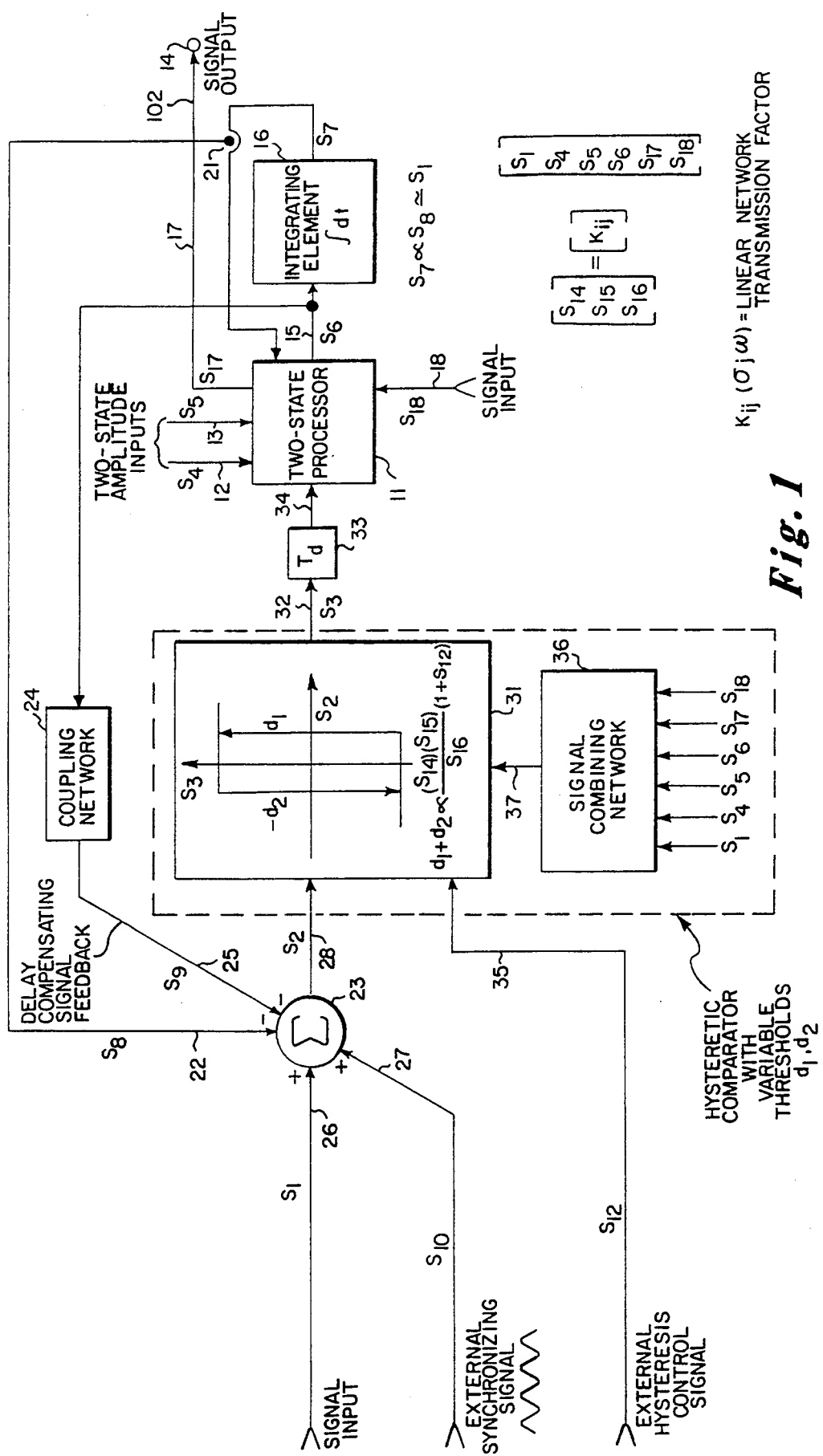
FIGS. 1 and 2 are block diagrams illustrating the logical arrangement of a frequency stabilized two-state modulation system according to the invention.

With reference now to the drawing and more particularly FIG. 1 thereof, there is shown a frequency-stabilized two-state modulation system according to the invention. The system includes a two-state processor 11 that receives two-state amplitude inputs $S_4$ and $S_5$ on lines 12 and 13, respectively, typically D.C. potentials corresponding to $E_a$ and $E_b$ in the system described in U.S. Pat. No. 3,294,981. Two-state processor 11 provides an output signal $S_{17}$ on output terminal 14, and delivers a signal of rectangular waveform $S_6$ on line 15 to integrating element 16 that provides an integrated signal $S_7$ on line 17 that is fed back to two-state processor 11. Two-state processor 11 also receives a signal $S_{18}$ on input line 18.

Coupling means 21 couples a signal $S_8$ derived from line 17 to input line 22 of signal combiner 23.

Coupling network 24 couples the signal on line 15 to input 25 of combiner 23 to provide a signal $S_9$ related to signal $S_6$. Input line 26 of combiner 23 receives a signal $S_1$, and input line 27 receives a signal $S_{10}$, typically an external synchronizing signal for combination with the other signals in the inputs of combiner 23, to provide a combined signal $S_2$ on output line 28 applied as a switching signal to hysteretic element 31 that provides an output signal $S_3$ on output line 32 that receives a delay of $T_d$ represented by delay means 33 before effecting switching of two-state processor 11 on input line 34. Hysteretic element 31 may also receive an external hysteresis control signal $S_{12}$ on input line 35. A signal combining network 36 combines signals $S_1$, $S_4$, $S_5$, $S_6$, $S_{17}$ and $S_{18}$ on the indicated input lines to provide a signal on output line 37 that is the ratio of the product of signals $S_{14}$ and $S_{15}$ to signal $S_{16}$ with these signals related by the following matrix equation $$\begin{bmatrix} S_{14} \\ S_{15} \\ S_{16} \end{bmatrix} = [K_{ij}] \begin{bmatrix} S_1 \\ S_4 \\ S_5 \\ S_6 \\ S_{17} \\ S_{18} \end{bmatrix}$$

The threshold levels for switching $d_1+d_2$ vary according to the sum of the signals on lines 35 and 37. If the signal on line 35, $S_{12}$, is zero, then this threshold control is a function of the input signal $S_1$ on line 26, the two-state amplitude inputs $S_4$ and $S_5$, the signal on line 15, $S_6$, the output signal $S_{17}$ and the input signal $S_{18}$ to two-state processor 18.

Figure 2:
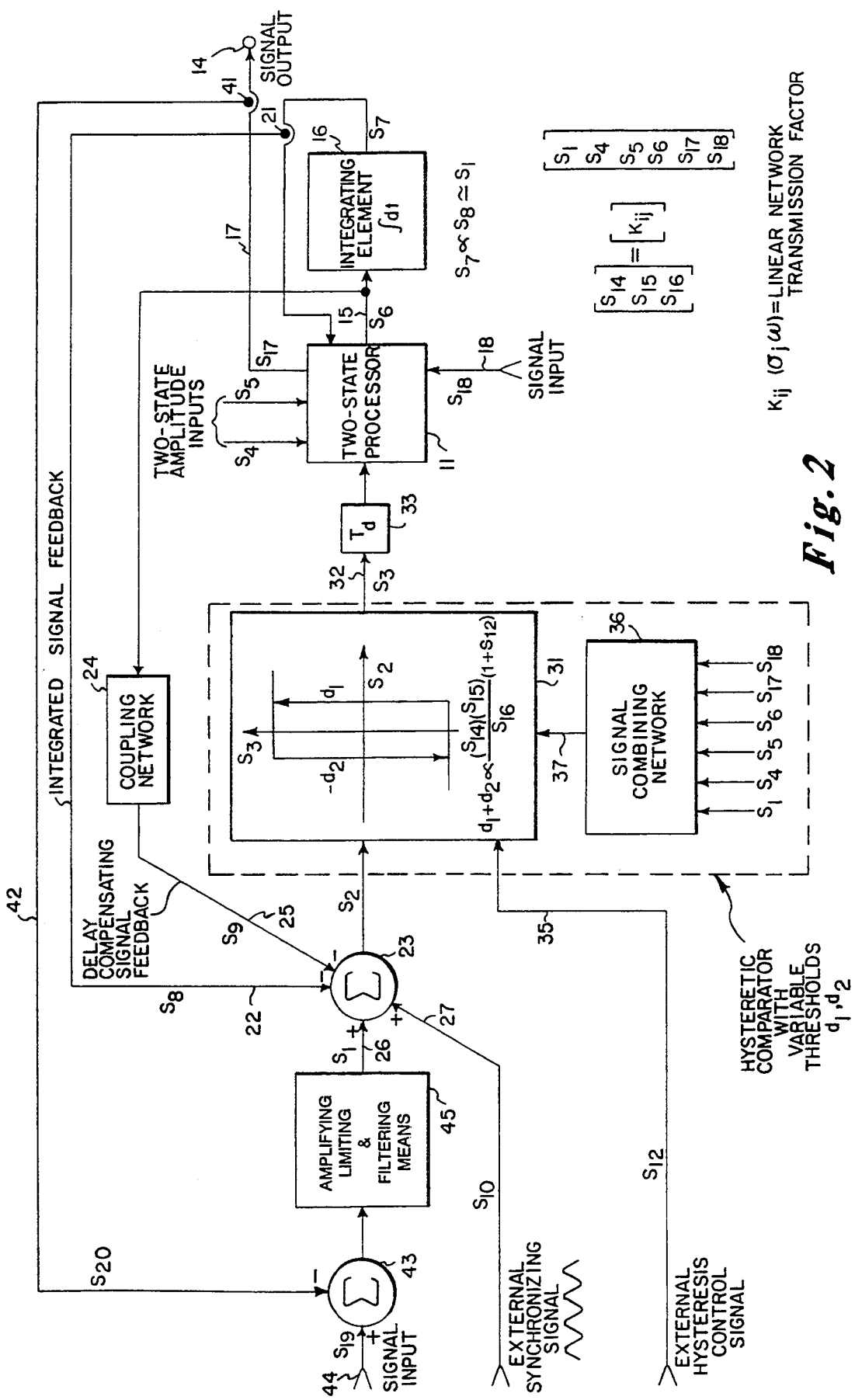

Referring to FIG. 2, there is shown a modification of the embodiment of FIG. 1 using additional feedback from the output together with amplifying, limiting and filtering means that provides input signal $S_1$ on line 26. This embodiment includes sensing and coupling means 41 that provides a feedback signal $S_{20}$ on line 42 representative of the output signal on terminal 14 that is delivered to the − input of summing network 43. The + input of summing network 43 receives a signal $S_{19}$ on input terminal 44 to provide a combined signal on its output that is applied to amplifying, limiting and filtering means 45 to provide signal $S_1$ on line 26. Amplifying, limiting and filtering means 45 may be used, for example, to restrict the maximum modulation that the system will exhibit. Output signal $S_{17}$ varies as a function of feedback signal $S_{20}$ which is nearly the same as signal $S_{19}$.

Figure 3:
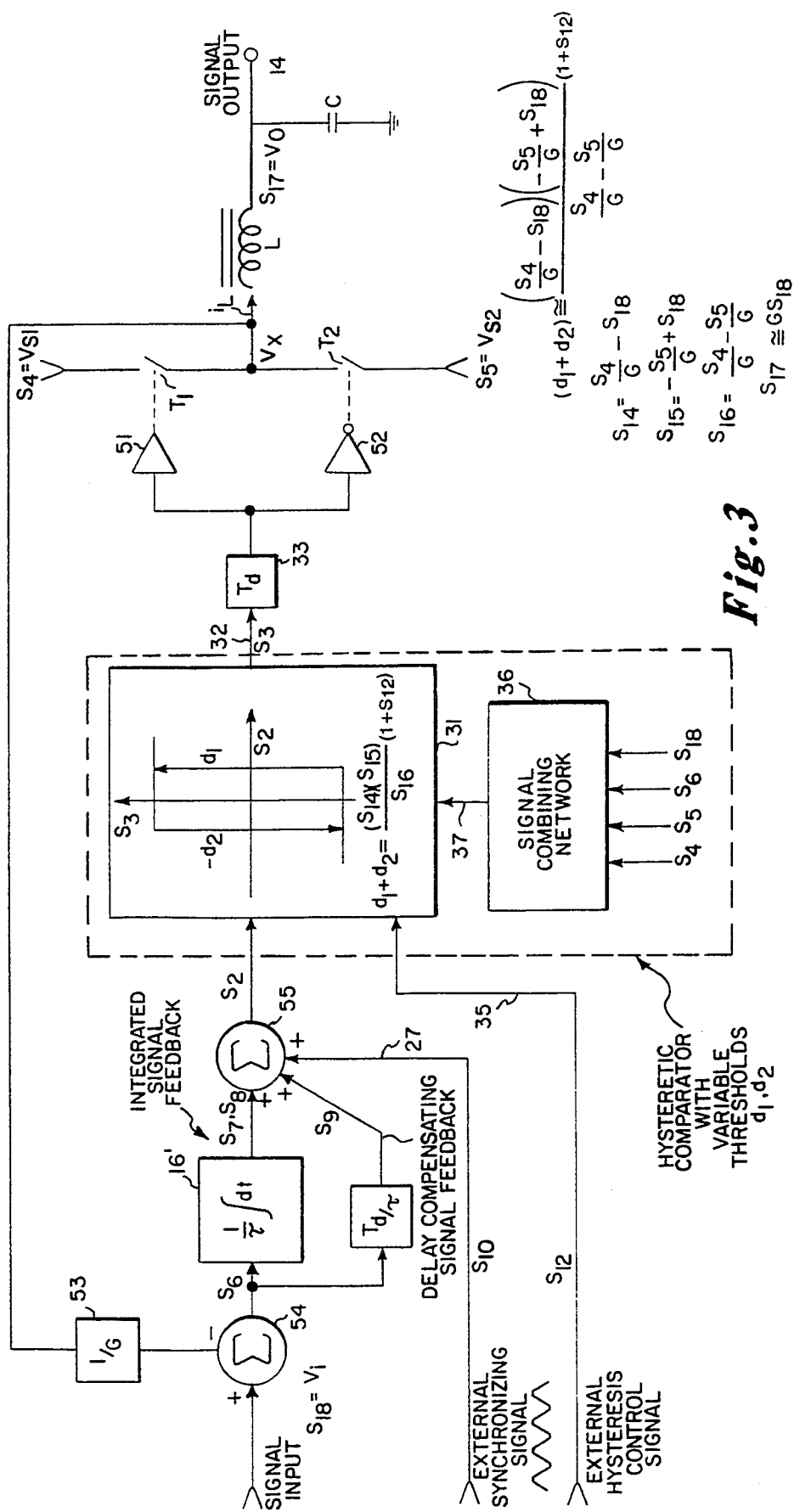
FIG. 3 is a block diagram illustrating a frequency-stabilized two-state modulation system operating a direct power stage.

Referring to FIG. 3, there is shown a combined block-schematic circuit diagram illustrating the logical arrangement of a system according to the invention having a direct power stage with switched devices $T_1$ and $T_2$ and an inductor L in series with output terminal 14 and the junction of switching devices $T_1$ and $T_2$. A capacitor C is connected between output terminal 14 and ground.

Digital buffer 51 and inverting digital buffer 52 drive switching devices $T_1$ and $T_2$ so that the two devices are alternately conductive during mutually exclusive time intervals. A feedback signal is derived from the junction of switching devices $T_1$ and $T_2$ and attenuated by attenuator 53 to provide a signal on one − input of summer 54 that receives an input signal $S_{18}$ on the + input of summer 54 to provide a combined signal $S_6$ delivered to integrating element 16' that provides signal $S_7$ at its output delivered to one + input of summer 55. Summer 55 also receives a signal on a second + input that provides delay compensating signal feedback through the feed forward path including network 56 that furnishes attenuation $T_D/\tau$. An external sync signal $S_{10}$ may be coupled to the third + input of summer 55. In this embodiment integration occurs in the loop including the feedback path before the hysteretic switch.

Figure 4:
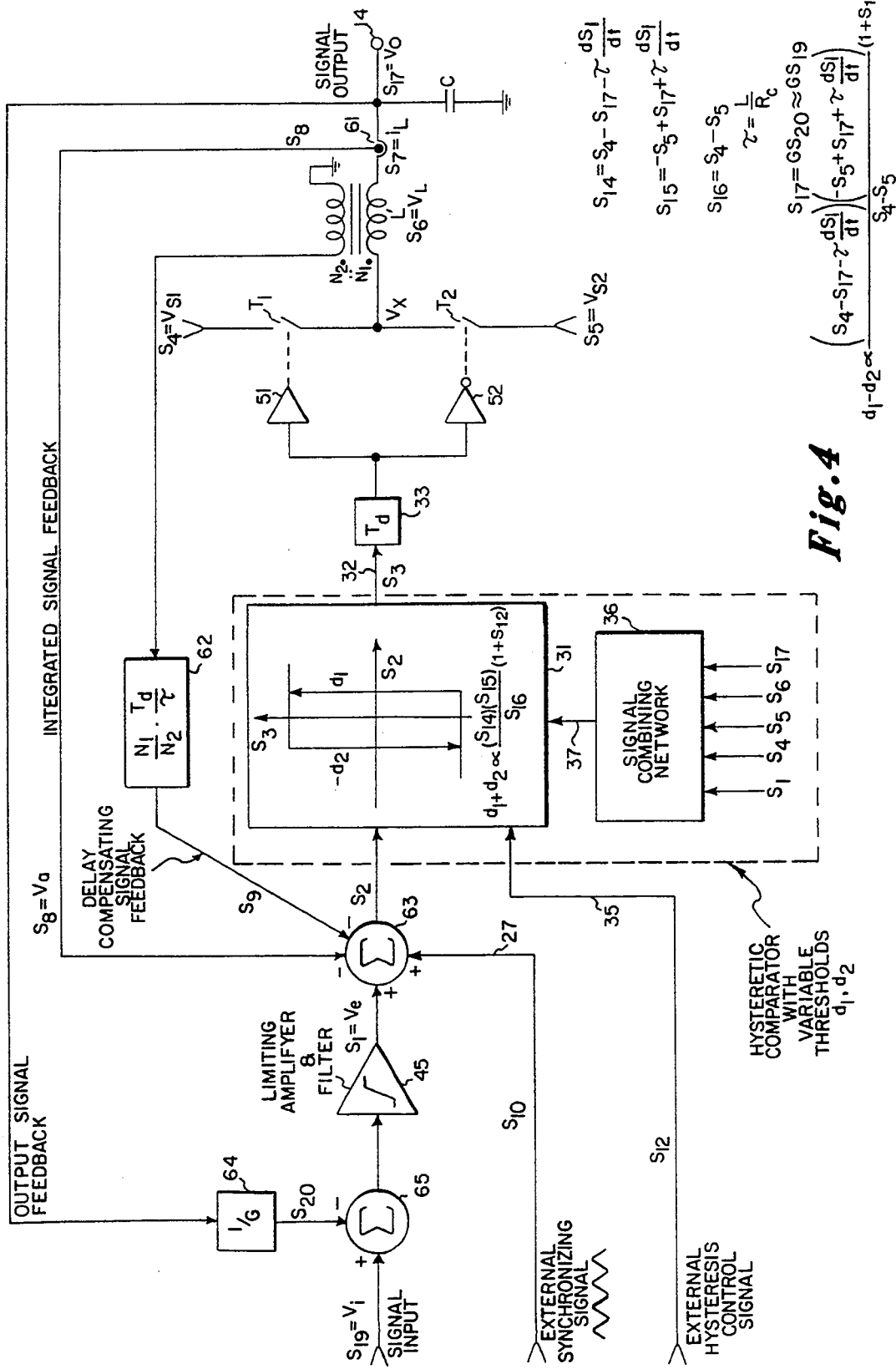
FIG. 4 is a block diagram illustrating a frequency-stabilized current-controlled two-state modulation system operating a direct power stage.

Referring to FIG. 4 there is shown another embodiment of the invention with a direct power stage having both integrated signal feedback and output signal feedback using current-controlled two-state modulation system. Current sensor 61, typically a resistor of small value, provides a feedback signal representative of the current through the winding of inductor L' having $N_1$ turns coupled to the other winding having $N_2$ turns and providing a delay compensating signal through network 62 to provide signal $S_9$ at one − input of combiner 63. Current feedback signal $S_8$ is applied to a second − input of summer 63. Output signal feedback is coupled through attenuator 64 to the − input of summer 65. The + input of summer 65 receives an input signal $S_{19}$ to provide a combined signal that is delivered to amplifying, limiting and filtering means 45 to provide the signal $S_1$ at a + input of summer 63. The equations relating the different signals to establish the variable threshold between $d_1$ and $d_2$ are:

$$d_1 + d_2 \simeq \frac{\left(S_4 - S_{17} - \tau \frac{dS_1}{dt}\right)\left(-S_5 + S_{17} + \tau \frac{dS_1}{dt}\right)}{S_4 - S_5}(1 + S_{12})$$

$$S_{14} = S_4 - S_{17} - \tau \frac{dS_1}{dt}$$

-continued $$S_{15} = S_5 + S_{17} + \tau \frac{dS_1}{dt}$$

$$S_{16} = S_4 - S_5$$

Figure 5:
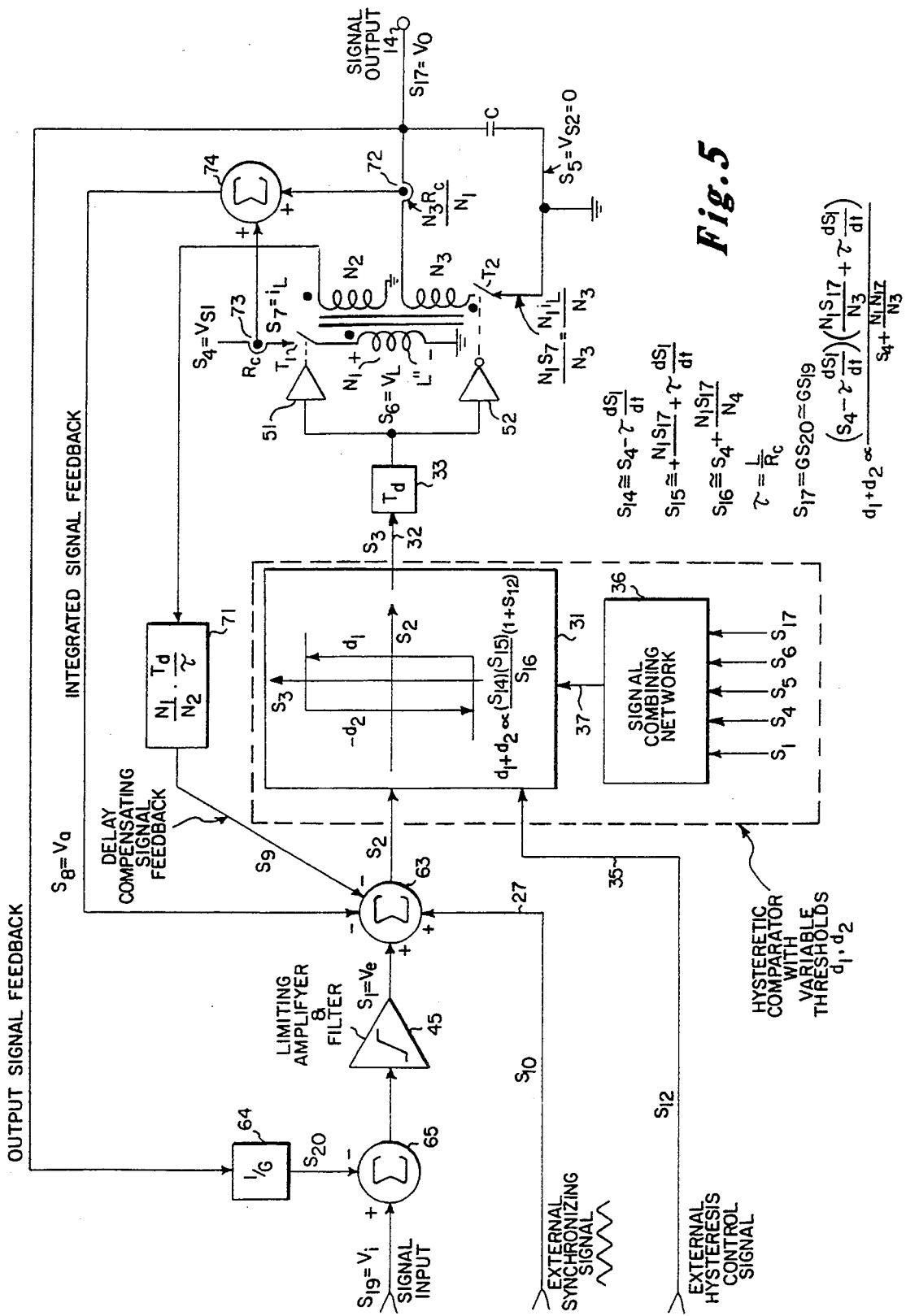
FIG. 5 is a block diagram illustrating a frequency-stabilized current-controlled two-state modulation system operating a fly-back power stage.

Referring to FIG. 5, there is shown a block-schematic circuit diagram of another embodiment of the invention of a current-controlled two-state modulation system with a flyback power stage with frequency stabilization according to the invention. This embodiment of the invention includes an inductor $L''$ having a winding with $N_1$ turns connected in series with switching device $T_1$ and a winding of $N_3$ turns connected in series between switching device $T_2$ and output terminal 14. Inductor $L''$ has a third feedback winding of $N_2$ turns providing a signal through network 71 that furnishes delay compensating feedback signal $S_9$ to a − terminal on summer 63. Current sensors 72 and 73 provide signals related to the current flowing through switching devices $T_2$ and $T_1$, respectively, to furnish signals on respective + inputs of summer 74 that provides an integrated feedback signal $S_8$ on a second − input of summer 63.

The equations relating the various signals with the variable threshold span $d_1$-$d_2$ are given by:

$$d_1 + d_2 \simeq \frac{\left(S_4 - \tau \frac{dS_1}{dt}\right)\left(\frac{N_1 S_{17}}{N_3} + \tau \frac{dS_1}{dt}\right)}{S_4 + \frac{N_1 S_{17}}{N_3}} (1 + S_{12})$$

$$S_{14} \simeq S_4 - \tau \frac{dS_1}{dt}$$

$$S_{15} \simeq + \frac{N_1 S_{17}}{N_3} + \frac{dS_1}{dt}$$

$$S_{16} \simeq S_4 + \frac{N_1 S_{17}}{N_3}$$

$$\tau = L/R_c$$

For determining $\tau$, the inductance L is the inductance presented at the input of the winding with $N_1$ turns, and the resistance $R_c$ is that in series with switching device $T_1$. The resistance in series with switching device $T_2$ is $N_3/N_1 R_c$.

Figure 6:
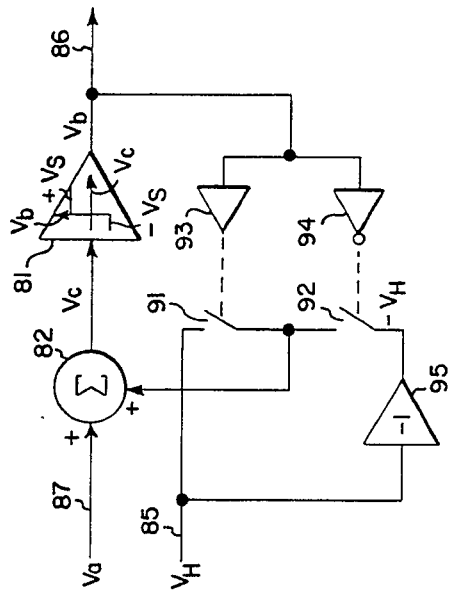
FIG. 6 illustrates one technique for creating variable hysteresis.

Referring to FIG. 6, there is shown a block diagram illustrating the logical arrangement of a system for creating variable hysteresis. A comparator 81 receives the output $v_c$ from summer 82 that combines an input signal $v_a$ with a feedback signal provided through multiplier 83 representing the product of a signal fed back from the output of comparator 81 through attenuating network 84 with a hysteresis controlling signal $v_H$ on line 85. Comparator 81 provides a two-state output signal $v_b$ moving between levels $v_s$ and $-v_s$.

The polarity of the feedback path through attenuator 84 and multiplier 83 is arranged so that the signal component reaching the input of the comparator through summer 82 reinforces the state present at the output of comparator 81. When the comparator is in the positive state at output terminal 86, the input signal at input terminal 87 must become sufficiently negative to overcome the effect of positive feedback through network 84 and multiplier 83 before comparator 81 will switch to the negative state at output terminal 86. Conversely, if the comparator output signal is in the negative state, the input signal on terminal 87 must become sufficiently positive to overcome the negative feedback passing through coupling network 84 and multiplier 83. The hysteresis area created through the use of positive feedback when the hysteresis control signal $v_H$ is unity is proportional to the attenuation factor H of attenuating network 84. Multiplier 83 provides a feedback signal dependent on the signal $v_H$ at hysteresis control input 85.

Figure 7:
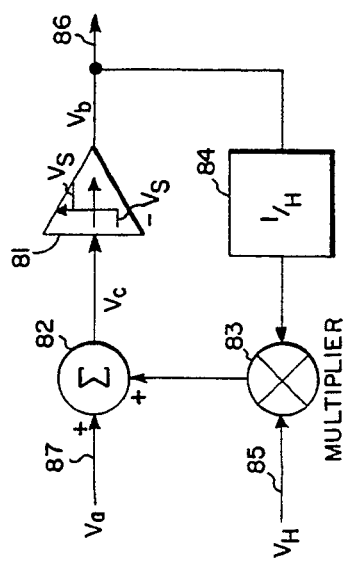
FIG. 7 shows the hysteresis characteristic created with the system of FIG. 6.

Referring to FIG. 7, there is shown the hysteresis characteristic created with the system of FIG. 6 in which the magnitude of the threshold levels $d_1$ and $d_2$ are directly proportional to the amplitude of signal $v_H$ and inversely proportional to H.

Figure 8:
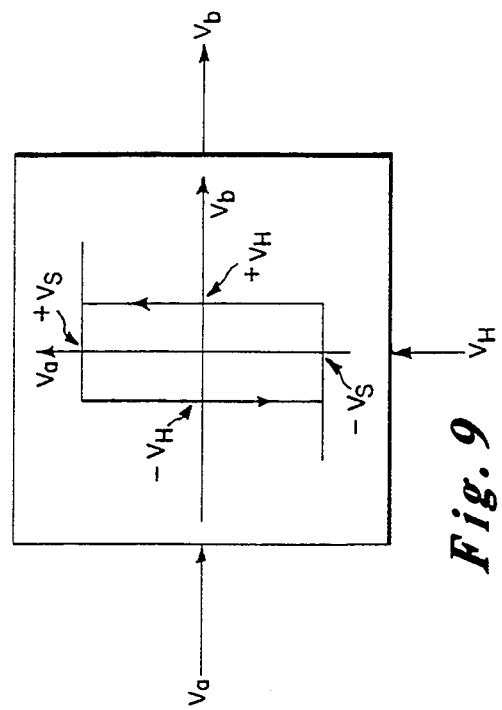
FIG. 8 shows a system using analog switches to provide variable hysteresis.
Figure 9:
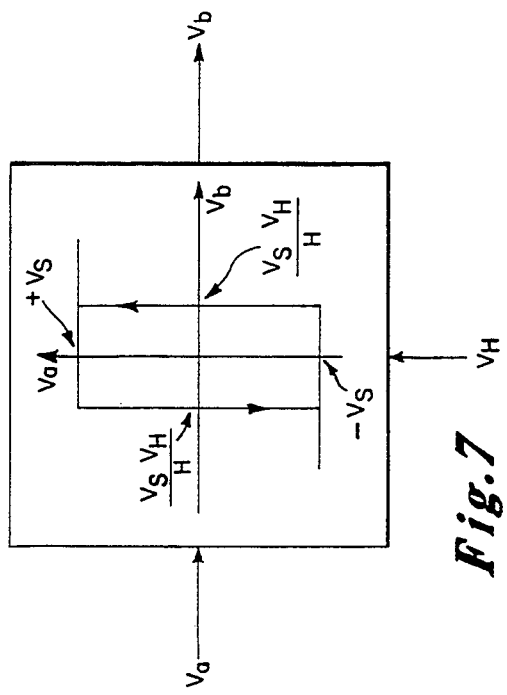
FIG. 9 shows the hysteretic transfer characteristic of the system of FIG. 8.

Referring to FIG. 8, there is shown a system using analog switches to provide variable hysteresis. The output signal on line 86 controls analog switches 91 and 92 through buffer 93 and inverting buffer 94, respectively. When the output signal $v_b$ of comparator 81 is positive, switch 91 is closed, connecting the control signal $v_H$ on line 85 to summer 82. When the output signal $v_b$ from comparator 81 is negative, switch 91 is open and switch 92 closes, connecting the inverse of hysteresis control signal $v_H$ on line 85 through inverting amplifier 95 to summer 82. The resulting hysteretic transfer characteristic is shown in FIG. 9. The threshold levels $d_1$ and $d_2$ are dependent solely upon the magnitude of control signal $v_H$.

Having discussed a number of systems and some specific techniques for controlling the threshold voltage span $d_2+d_1$, it is appropriate to consider the mode of operation of a system. Referring to FIG. 1, a signal input $S_1$ may be applied to line 26 or a signal $S_{18}$ applied to line 18. As a result an output signal $S_{17}$ related to the signal input is provided at output terminal 102. Combining means 23 provides a signal to operate hysteretic comparator 31. The two-state signal produced at the output of hysteretic comparator 31 controls operation of two-state processor 11.

Two-state processor 11 receives two amplitude defining inputs $S_4$ and $S_5$ at terminals 12 and 13, respectively, and provides a signal $S_6$ on line 15 that is delivered to integrating element 16. In TSM, $S_6$ is the output of the combining means summing the input signal with the two-state signal. $S_{17}$ is the output of L-C filter connected to the two-state signal. In CCTSM, $S_6$ is the two-state voltage applied to the L-C filter. $S_{17}$ is the output of L-C filter. $S_7$ is the current flowing from the two-state switch into the inductor, L, of the L-C filter. In CCTSM, the two-state processor includes the L-C filter elements. Therefore, the sawtooth signal on $S_7$ feedback is the current flow to the inductor, L. In TSM, $S_7$ the signal feedback to the two-state processor 11 is not used. The signal, $S_7$, provided by integrating element 16 on line 17 includes a sawtooth component fed back to two-state processor 11. Sensing and coupling means 21 provides an integrated feedback signal $S_8$ on line 22 on a − input of combining means 23. This feedback signal is connected to combining means 23 with a polarity to create high frequency two-state oscillation at the hysteretic comparator output line 32. Unavoidable delays present in the processing represented by delay element 33 are compensated by action of a secondary feedback path comprising coupling network 24 and line 25 connected to combining means 23.

The signals provided on line 35, that receives an external hysteresis control signal $S_{12}$, and line 37, at the output of signal combining network 36, control the width of the hysteresis loop; that is, the span between threshold levels $d_1$ and $d_2$. These signals may not only control error signals in the two-state modulation system, but also modify the switching frequency.

An external synchronizing input signal $S_{10}$ may also be applied on line 27 to combining means 23. Typically synchronizing signal $S_{10}$ may be a sawtooth signal synchronizing the switching frequency of the two-state modulation system to an external clock.

Referring to FIG. 2, operation of this system that includes the addition of output signal feedback will be described. A signal input $S_{19}$ is applied on line 44 to combining means 43. Combining means 43 also receives an output feedback signal $S_{20}$ on line 42 from sensing and coupling means 41. This output feedback signal causes the signal at output terminal 14 to accurately track the signal present on input 44. The addition of this output feedback signal also provides additional advantages. There is a lower output impedance characteristic at output terminal 14, and internal signal limiting protects lower semiconductor devices within two-state processor 11.

Amplifying, limiting and filtering means 45 responds to the output signal from combiner 43 to provide an error signal on line 26 to combining means 23. Amplifying, limiting and filtering means 45 includes limiting levels which prevent excessive signals from occurring within the modulation system and filtering means for significantly attenuating spectral components at the switching frequency and above.

Referring to FIG. 3, the operation of the system including the direct power stage will be described. Delay element 33 represents the delays which would occur in power switches $T_1$ and $T_2$. Power switches $T_1$ and $T_2$ alternately connect voltages $S_4$ and $S_5$ to their junction. The two-state voltage signal at this junction is connected through attenuator 53 to combining means 54 that combines the input signal $S_{18}$ with this feedback signal to provide signal $S_6$ applied to the input of integrator 16' and delay compensation means 56 to provide the integrated feedback signal $S_7$ (equal to $S_8$), the compensating signal $S_9$ and an external sync signal $S_{10}$, if present, combined by combining means 55 to provide switching signal $S_2$ to hysteretic comparator 31.

In a two-state modulation system the input signal $S_{18}$ is slowly varying relative to the rate of two-state switching by hysteretic comparator 31 and following circuitry. The period, T, of two-state operation can then be expressed as:

$$T = T_d \cdot \frac{(S_a - S_b)^2}{-S_a S_b} + \tau h \cdot \frac{(S_a - S_b)}{-S_a S_b} \quad (1)$$

where $$S_a = \frac{S_4}{G} - S_{18} > 0, \; S_b = -\frac{S_5}{G} - S_{18} < 0, \; h = d_1 + d_2$$

Typically, signal $S_{18}$ is an input voltage, $v_i$; and signals $S_4$ and $S_5$ are dc supply voltages where $S_4 = -S_5 = v_s$. The hysteresis is, generally, a voltage $h = v_s 20$. Under these conditions, the switching period can be expressed as:

$$T = (4T_d + \tau) \frac{v_s^2}{(v_s - Gv_i)(v_s + Gv_i)} \quad (1A)$$

and G is the attenuation imparted by attenuator 53. The switching period is a function of two signal conditions $S_a$ and $S_b$ defined at the output of combining means 54. The switching frequency is variable dependent upon these conditions and is also influenced by the time delay represented by delay means 33.

The effect of time delay may be eliminated for certain signal ranges with delay compensation with the feed forward comprising feed forward attenuation network 56 and associated lines. The feed-forward signal shifts the apparent thresholds of the hysteretic comparator 31 to advance the switching of the comparator to compensate for the time delay. The period with delay compensation may be expressed as:

$$T \simeq \tau h' \frac{S_a - S_b}{-S_a S_b} = \tau \cdot \frac{v_s^2}{(v_s + Gv_i)} (v_s + Gv_i) \quad (2)$$

$$h = v_s/2G$$

$$h' = h - \frac{T_d}{\tau} \cdot (S_a - S_b) = \left(\frac{1}{H} - \frac{T_d}{\tau}\right) \cdot 2v_s$$

Referring to FIG. 4, in this current-controlled two-state modulation system high frequency operation at switching frequency occurs through current feedback signal $S_8$ and delay compensating feedback signal $S_9$. Voltage feedback signal $S_{20}$ maintains substantial conformity between the output signal on output terminal 14 and the input signal $S_{19}$. Equation 3 is an expression for the switching period with feedback from the junction of switching devices T1 and T2 to combining means 63:

$$T = \frac{T_d (S_a - S_b)^2 + \tau h (S_a - S_b)}{\left(S_a - \tau \frac{dS_1}{dt}\right)\left(-S_b + \tau \frac{dS_1}{dt}\right)} \quad (3)$$

where $$S_a = v_s - v_o > 0, \; S_b = -v_s - v_o < 0, \; h = d_1 - d_2$$

Typically, $S_1$ is the average value of a voltage $\bar{v}_a \simeq R_c i_L$ where $i_L$ is the local average current in inductor, L', and $R_c$ is the gain resistance of current sensor 61. In this case $n = v_s/2$. Therefore, equation (3) becomes:

$$T \simeq (4T_d + \tau) \cdot \frac{h = v_s/2}{\left(v_s - v_o - \tau \frac{dv_a}{dt}\right)\left(v_s + v_o + \tau \frac{dv_a}{dt}\right)} \quad (3A)$$

The switching period is dependent upon the voltages existing within the system and upon the time delay without delay compensation. It is possible to compensate for the time delay through the use of additional feedback compensation as shown in FIG. 4. A delay compensation feedback signal $S_9$ is derived from the winding having $N_2$ turns of inductor L'. Inductor L' corresponds to an integrating element, such as 16. The signal from the winding of $N_2$ turns is coupled through attenuating network 62 to a − input of combining means 63. In this embodiment delay compensation is achieved with feedback in contrast to FIG. 3 where delay compensation is achieved using feedforward. In both cases the delay compensation is effected by coupling an attenuated portion of the signal applied to an integrating element to combining means that drives the hysteretic comparator. The switching period with delay compensation may be expressed as:

$$T \simeq \frac{\tau h(S_a - S_b)}{\left(S_a - \tau \frac{dS_1}{dt}\right)\left(-S_b + \tau \frac{dS_1}{dt}\right)} = \quad (4)$$

$$\frac{v_s^2 \tau}{\left(v_s - v_o - \tau \frac{dv_a}{dt}\right)\left(v_s + v_o + \tau \frac{dv_a}{dt}\right)}$$

$$h + v_s/2$$

$$h' = h - \frac{T_d}{\tau}(S_a - S_b) = 2\left(\frac{R_c}{R_H} - \frac{T_d}{\tau}\right)v_s \quad (20)$$

The following equations give the derivation of the switching period T. The voltage $S_1$ is the output voltage from the integrating element, such as 16. The voltage $S_a$ is the signal applied to the integrator, such as element 16, during time interval $T_1$. The voltage $S_b$ is the voltage applied to the integrator such as element 16, during interval $T_2$. The expression for switching T shown in equation 9 is valid in instances where time delays are negligible. By providing a hysteresis control voltage reciprocally dependent upon $S_a$, $S_b$ and $S_1$, the switching period T becomes constant. Using $$\frac{dS_1}{dt} \overset{\Delta}{=} \frac{S_1(t_o + T) - S_1(t_o)}{T} \quad (5)$$

typically $S_1 = v_a = R_c i_L = v_e$ $$\frac{dS_1}{dt} = \frac{v_a(t_o + T) - v_a(t_o)}{T} \quad (5A)$$

using $S_a$ and $S_b$ as defined in equation 3 above, $$\frac{1}{\tau} S_a T_1 = h + \frac{dS_1}{dt} T_1 \quad (6)$$

where $\tau \overset{\Delta}{=} \frac{L'}{R_c}$ $$\therefore T_1 = \frac{h\tau}{S_a - \tau \frac{dS_1}{dt}} \quad (7)$$

and $$T_2 = \frac{h\tau}{-S_b + \tau \frac{dS_1}{dt}} \quad (8)$$

$$\therefore T = T_1 + T_2 = \quad (9)$$

$$h\tau \left[\frac{S_a - S_b}{\left(S_a - \tau \frac{dS_1}{dt}\right)\left(-S_b + \tau \frac{dS_1}{dt}\right)}\right]$$

$$d \overset{\Delta}{=} \frac{T_1}{T} = \frac{-S_b + \tau \frac{dS_1}{dt}}{S_a - S_b} \quad (10)$$

$$1 - d \overset{\Delta}{=} \frac{T_2}{T} = \frac{S_a - \tau \frac{dS_1}{dt}}{S_a - S_b} \quad (11)$$

Using the hysteresis control signal $$h = \frac{\left(S_a - \tau \frac{dS_1}{dt}\right)\left(-S_b + \tau \frac{dS_1}{dt}\right)}{(S_a - S_b)},$$

$S_a' + S_b$ as defined in equation (3)

the switching period is stabilized as $$T = \tau, \tau = \frac{L}{R_c} \quad (12)$$

Equations (5)–(12) apply where output signal feedback is utilized. When only a single feedback loop is used, the following equations apply:

$$T = \tau h \frac{S_a - S_b}{-S_a S_b} \quad S_a > 0 \quad S_b < 0 \quad (13)$$

using $h = \frac{-S_a S_b}{S_a - S_b}$ $T = \tau \quad \tau = $ time constant of integrator (14)

In the foregoing analysis, the effects of time delay have been neglected. The effect of time delay is to shift the apparent thresholds of the hysteresis. As a result, the apparent hysteresis at the input to a hysteretic comparator is greater than that simply caused by hysteresis feedback. To compensate for this delay-induced hysteresis, an additional feedback signal may be applied to the combining means at the input to the hysteretic comparator, as shown in FIG. 4. The appropriate modified feedback signals may be expressed as:

$$d_1' = d_1 - \frac{T_d}{\tau} S_a \quad (15)$$

$$d_2' = d_2 - \frac{T_d}{\tau} S_b \quad (16)$$

where $$h = d_1' - d_2' = d_1 + d_2 - \frac{T_d}{\tau}(S_a - S_b) =$$

$$h - \frac{T_d}{\tau}(S_a - S_b)$$

This delay compensation cannot maintain constant frequency operation over the total modulation range. The minimum duration of a particular state is two times the time delay. In this situation the expressions for switching period are given as:

$$T_2 = 2S_a T_d \left[\frac{1}{-S_b + \tau \frac{dS_1}{dt}}\right] \text{ for } T_2 >> T_1 \quad (17)$$

$$T = 2T_d \left[ \frac{S_a - S_b + \tau \frac{dS_1}{dt}}{-S_b + \tau \frac{dS_1}{dt}} \right] \text{ for } T_1 = 2T_d \quad (18)$$

$$T = 2T_d \left[ \frac{S_a - S_b + \tau \frac{dS_1}{dt}}{S_a - \tau \frac{dS_1}{dt}} \right] \text{ for } T_2 = 2T_d \quad (19)$$

Figure 10:
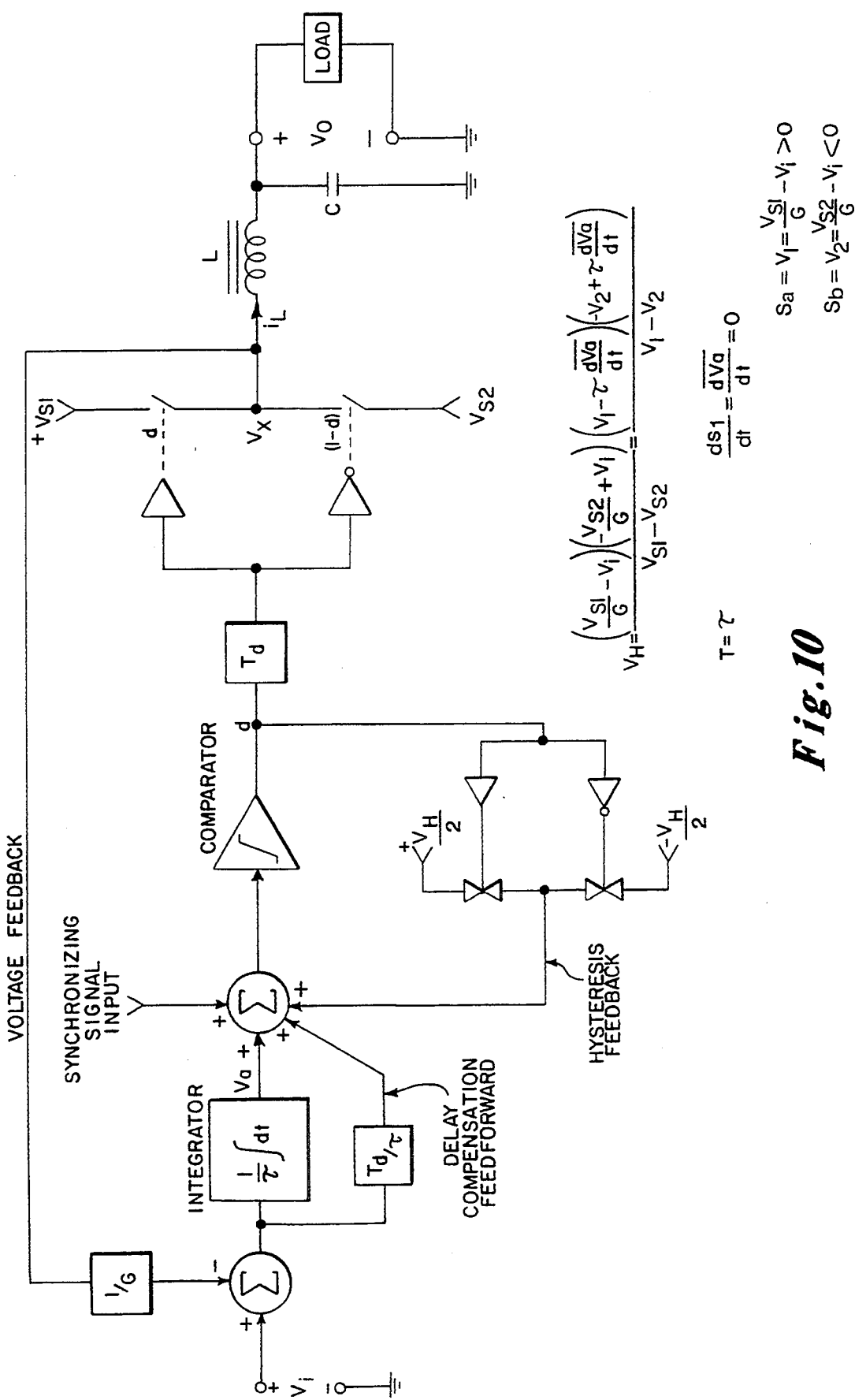
FIG. 10 is a combined block-schematic circuit diagram of a specific form of the two-state modulation system using analog switches.

Referring to FIG. 10, there is shown a combined block-schematic circuit diagram of a specific form of the two-state modulation system shown in FIG. 3 using analog switches of the type shown in FIG. 8. The hysteresis control voltage $v_H$ is given by equation 20.

$$v_H = \frac{(v_{S1} - Gv_i)(-v_{S2} + Gv_i)}{v_{S1} - v_{S2}} = \quad (20)$$

$$\frac{H}{2} \cdot \frac{\left(S_a - \tau \frac{dS_1}{dt}\right)\left(-S_b + \tau \frac{dS_1}{dt}\right)}{S_a - S_b}$$

Figure 11:
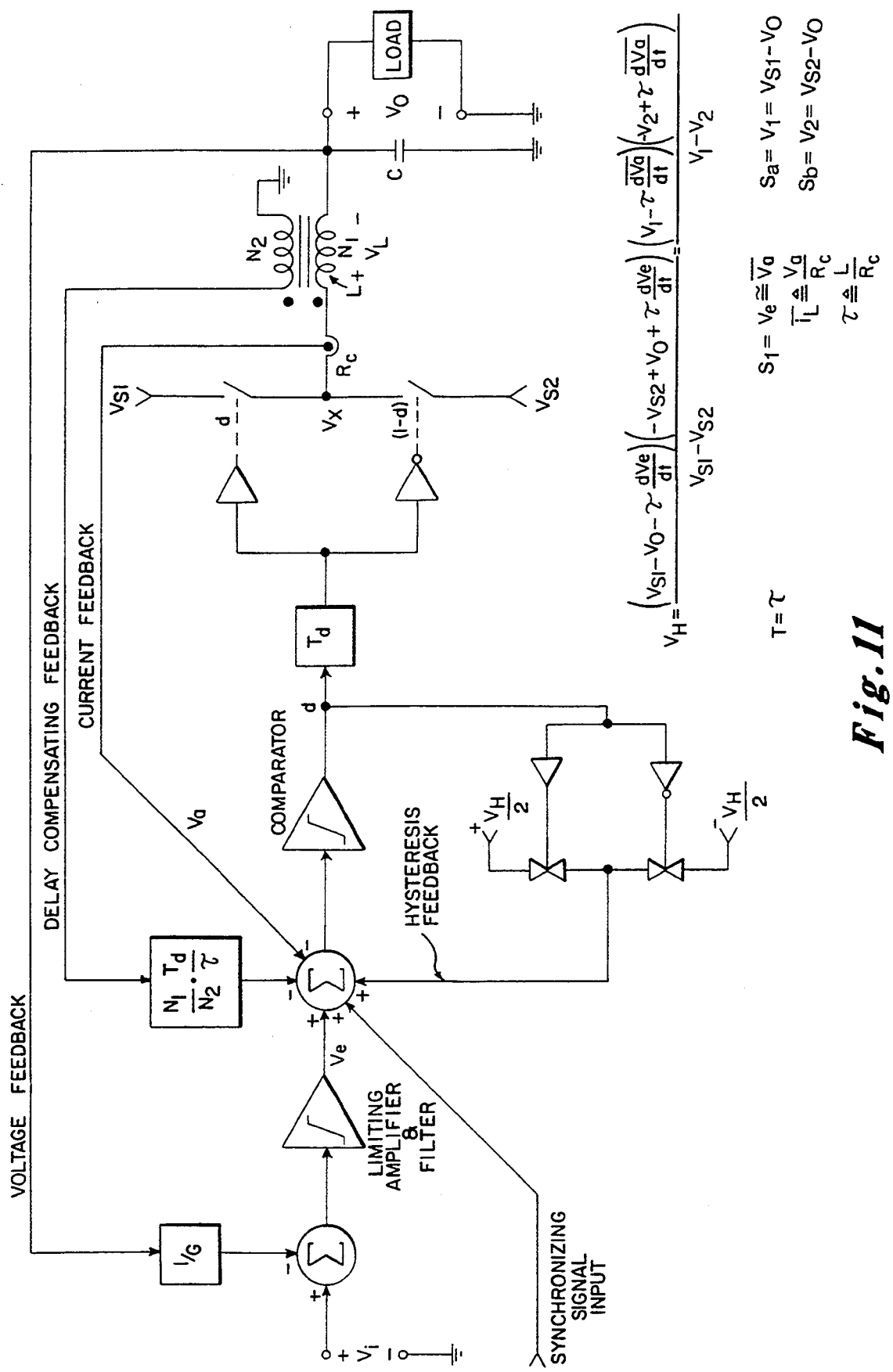
FIG. 11 shows a specific frequency-stabilized current-controlled two-state modulation system.

Therefore $T = \tau \frac{dS_1}{dt} = o, \ v_{S1} > o, \ v_{S2} < o$ $\tau =$ Integrator time constant Referring to FIG. 11, there is shown a specific frequency stabilized current-controlled two-state modulation system representing a specific form of the embodiment shown in FIG. 4. The hysteresis control voltage $v_H$ is given by:

$$\frac{\left(v_{S1} - v_o - \tau \frac{dv_e}{dt}\right)\left(-v_{S2} + v_o + \tau \frac{dv_e}{dt}\right)}{v_{S1} - v_{S2}} \quad (21)$$

Therefore $T = \tau S_1 = v_e, \ v_{S1} > o, \ v_{S2} < o$ $\tau = L/R_c$

Figure 12:
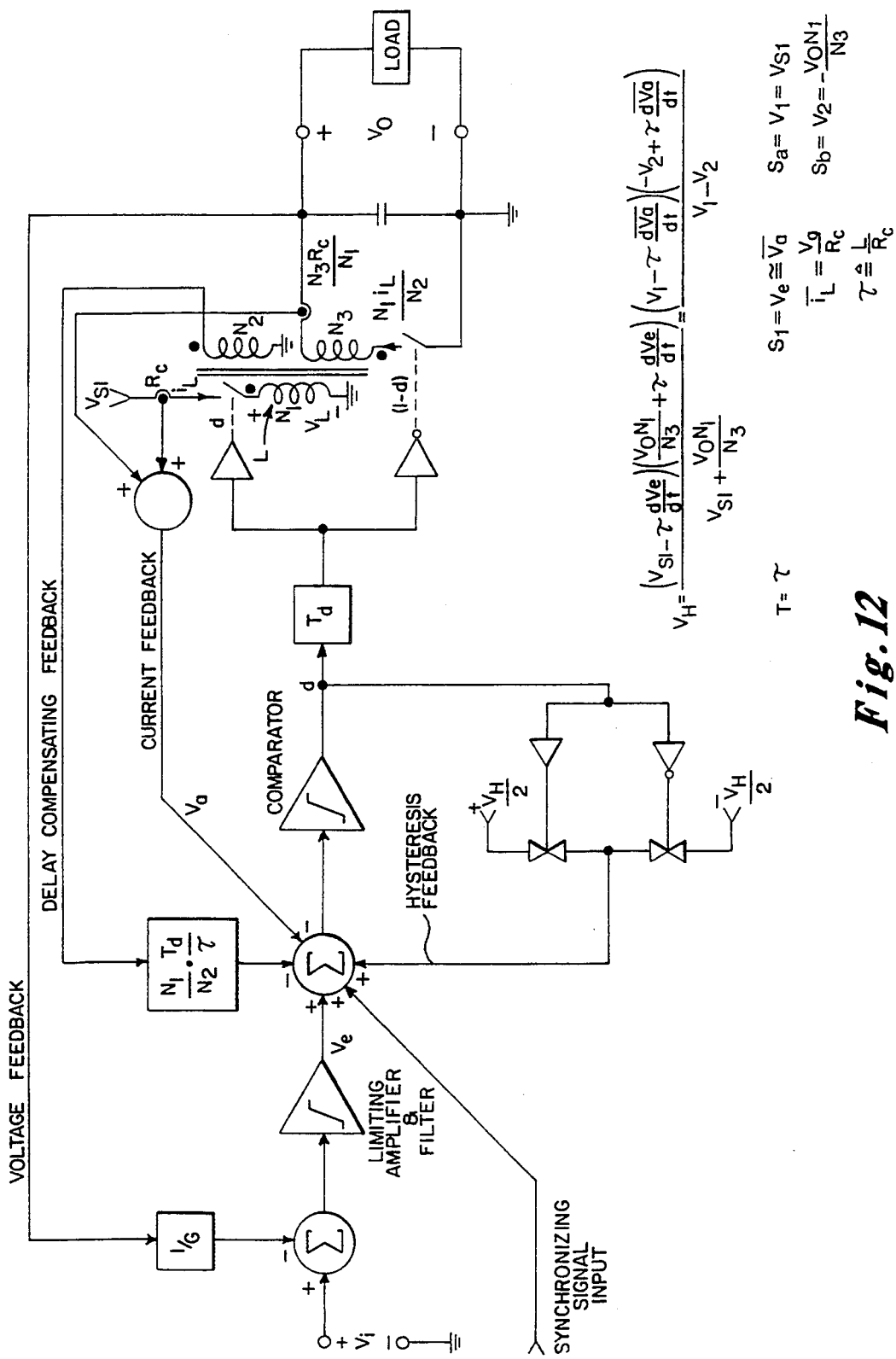
FIG. 12 shows a specific form of current-controlled two-state modulation system with a fly-back power stage.

Referring to FIG. 12 there is shown a specific form of a current-controlled two-state modulation system with a flyback power stage representing a specific form of the embodiment of FIG. 5. The hysteresis control voltage $v_H$ is given by:

$$v_H = \frac{\left(v_{S1} - \tau \frac{dv_e}{dt}\right)\left(\frac{N_1}{N_3} v_o + \tau \frac{dv_e}{dt}\right)}{v_{S1} + \frac{N_1}{N_3} v_o} = \quad (22)$$

$$\frac{\left(S_a - \tau \frac{dS_1}{dt}\right)\left(-S_b + \tau \frac{dS_1}{dt}\right)}{S_a - S_b}$$

Therefore $T = \tau S_1 = v_e, \ v_{S1} > o, \ v_o > o$ $\tau = L/R_c$

Figure 13:
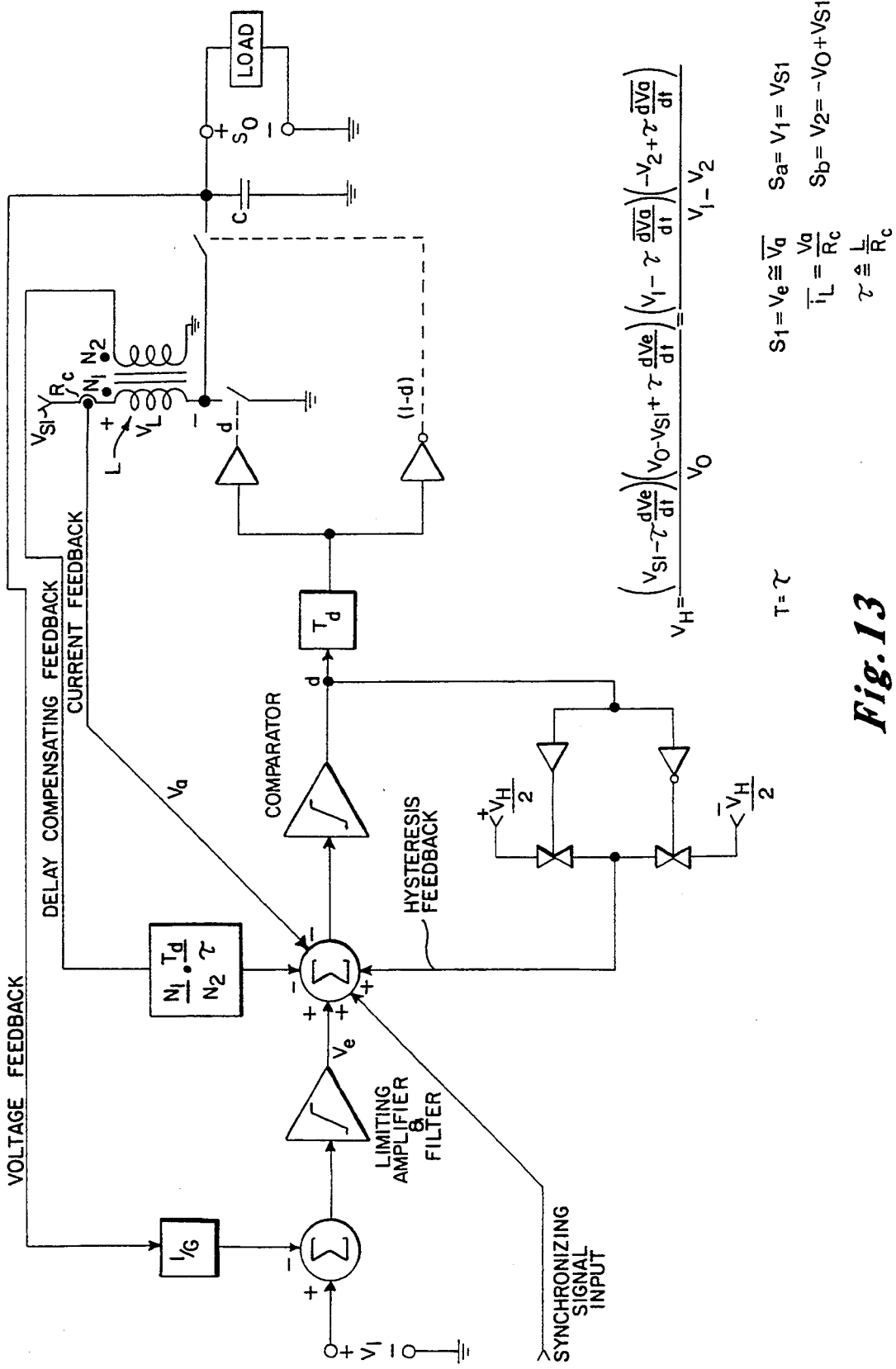
FIG. 13 shows a combined block-schematic circuit diagram of a specific form of current-controlled two-state modulation system with a boost power stage.

Referring to FIG. 13, there is shown a combined block-schematic circuit diagram of a specific form of current-controlled two-state modulation with a boost power state. The hysteresis control voltage $v_H$ is given by:

$$v_H = \frac{\left(v_{S1} - \tau \frac{dv_e}{dt}\right)\left(-v_{S1} + v_o + \tau \frac{dv_e}{dt}\right)}{v_o} = \quad (23)$$

$$\frac{\left(S_a - \tau \frac{dS_1}{dt}\right)\left(-S_b + \tau \frac{dS_1}{dt}\right)}{S_a - S_b}$$

Therefore $T = \tau S_1 = v_e, \ v_{S1} > o, \ v_o > v_{S1}$ $\tau = L/R_c$

The systems illustrated in FIGS. 10-13 are summarized in the following table:

TABLE 1

| MODULATION METHOD | POWER STAGE | $S_a = v_1$ | $S_b = v_2$ | $\tau \frac{dS_1}{dt} = \tau \frac{dv_a}{dt}$ |
|---|---|---|---|---|
| TSM | DIRECT | $\frac{v_{S1}}{G} - v_1$ | $\frac{v_{S2}}{G} - v_1$ | 0 |
| CCTSM | DIRECT | $v_{S1} - v_o$ | $v_{S2} - v_o$ | $\frac{L}{R_c} \frac{dv_e}{dt}$ |
| CCTSM | FLYBACK | $v_{S1}$ | $-\frac{N_1}{N_3} v_o$ | $\frac{L}{R_c} \frac{dv_e}{dt}$ |
| CCTSM | BOOST | $v_{S1}$ | $v_{S1} - v_o$ | $\frac{L}{R_c} \frac{dv_e}{dt}$ |

Figure 14:
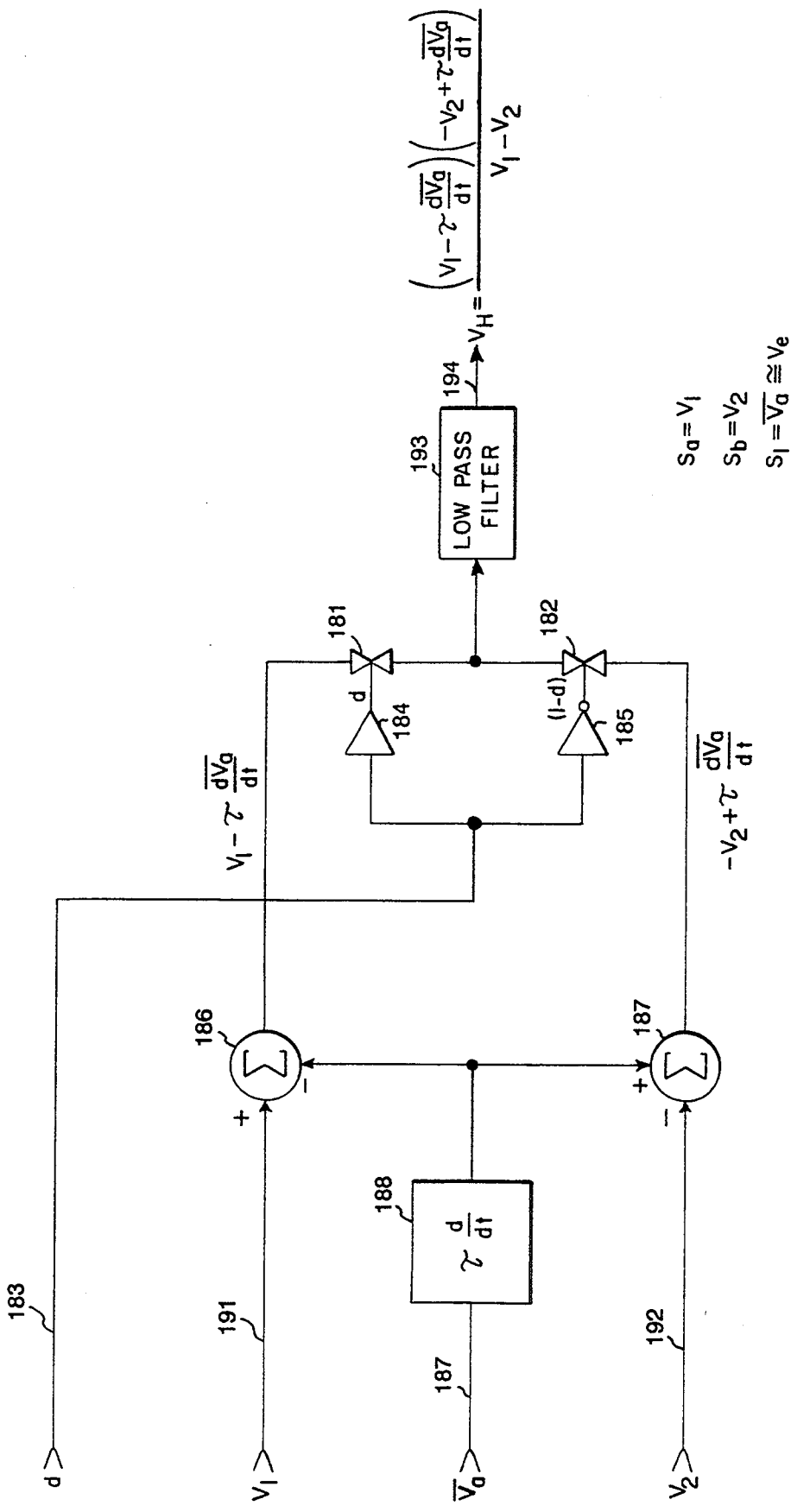
FIG. 14 shows a block diagram illustrating the logical arrangement of a system for providing a hysteretic control voltage.

Referring to FIG. 14, there is shown a block diagram illustrating the logical arrangement of a system for providing a hysteretic control voltage $v_H$. This system comprises analog switches 181 and 182. Line 183 receives a duty cycle signal that may, for example, be derived from hysteretic comparator 31. This duty cycle control signal is connected through buffer 184 to control analog switch 81 to be on when inverting buffer 185 couples the signal to analog switch 182 to control it to be off and vice versa. Switches 181 and 182 receive output signals from combining means 186 and 187, respectively.

S₁ is FIG. A, signal, such as is applied on line 200' to differentiator 188 to provide an output signal to the — input of combining means 186 and the + input of combining means 187. The + and — inputs of combining means 186 and 187 receive signals on lines 191 and 192, respectively, corresponding to the voltages $v_1$ and $v_2$, respectively. The signal on the junction of analog switches 181 and 182 is coupled through low pass filter 193 to provide on line 194 the hysteresis control signal $v_H$. This embodiment may be implemented with a single analog switch integrated circuit, such as an RCA CD 4066.

Figure 15:
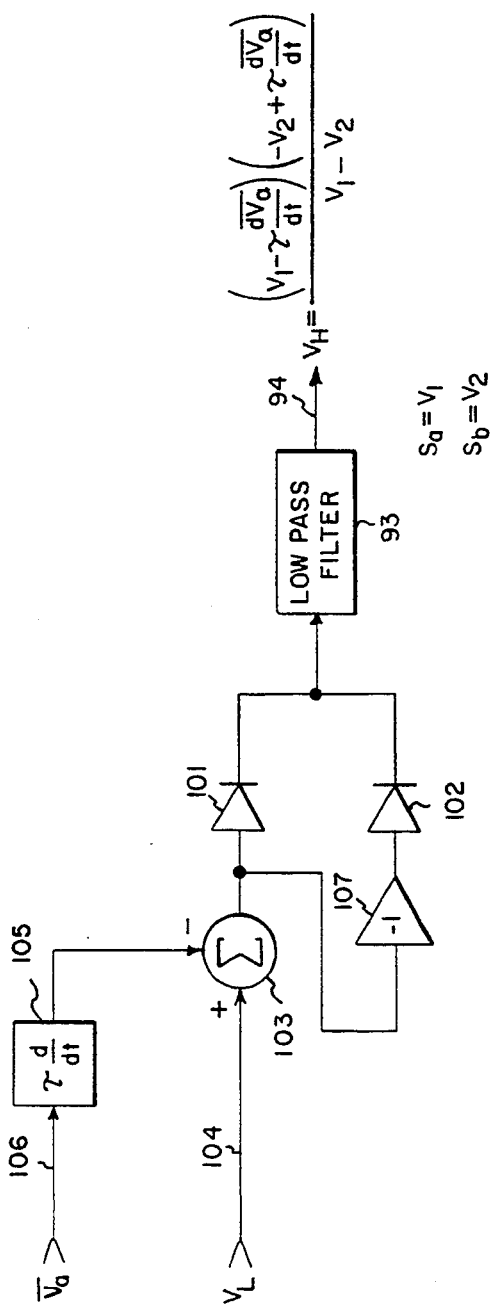
FIG. 15 shows a block diagram illustrating the logical arrangement of another form of apparatus for providing hysteresis control voltage using rectifiers.

Referring to FIG. 15, there is shown a block diagram illustrating the logical arrangement of another form of apparatus for providing the hysteresis control voltage $v_H$ using rectifiers 101 and 102. Combining means 103 receives an input signal $v_L$ related to the signal applied to the integrating element, such as signal $S_6$ in FIG. 4, on input line 104. Combining means 103 also receives a signal related to the derivative of the output of the integrator provided by differentiator 105 that receives a signal on line 106 representative of the output of the integrator, such as signal $S_7$. This signal may be derived, for example, from the output of amplifying and filtering means 45 in FIG. 4. The output signal from combining means 103 is inverted by inverting amplifier 107 to provide substantially the same signal but in phase opposition to rectifiers 101 and 102, which may be simple rectifiers or synchronously operated switches. The resulting combined rectified signal at their junction is coupled by low pass filter 193 to output 194 to provide a hysteresis control voltage.

Figure 16:
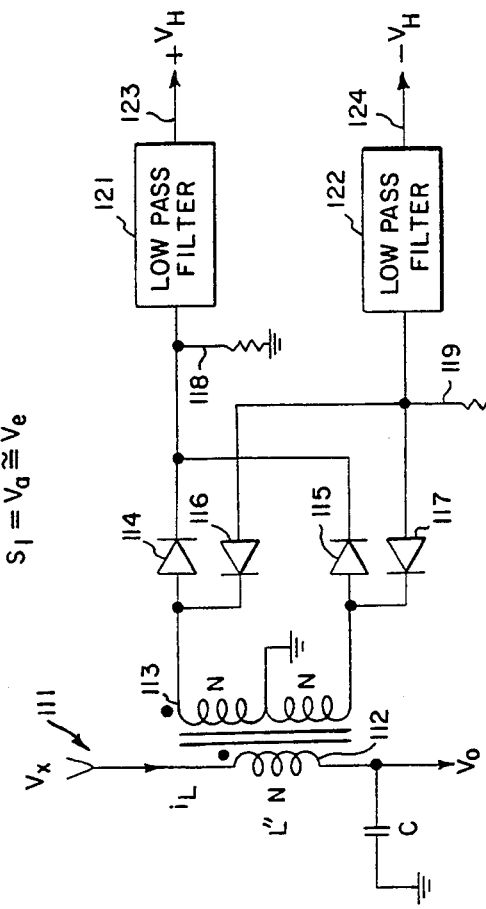
FIG. 16 shows another embodiment of the invention for providing the hysteresis control voltage where slowly varying signals are present.

Referring to FIG. 16, there is shown another embodiment of the invention for providing the hysteresis control voltage $v_H$ where slowly varying signals are present. This embodiment of the invention is especially advantageous when the integrating element comprises an inductor, such as inductor $L''$ shown in FIG. 5. An inductor 111, which may be inductor $L''$, comprises a primary winding 112 having a secondary winding 113 with the center tap grounded and rectifiers 114 and 115 connected to respective ends poled oppositely to rectifiers 116 and 117 connected to the same ends. The signals provided across resistors 118 and 119 are coupled by low-pass filters 121 and 122, respectively, to provide on lines 123 and 124, respectively, $+v_H$ and $-v_H$, respectively.

Figure 17:
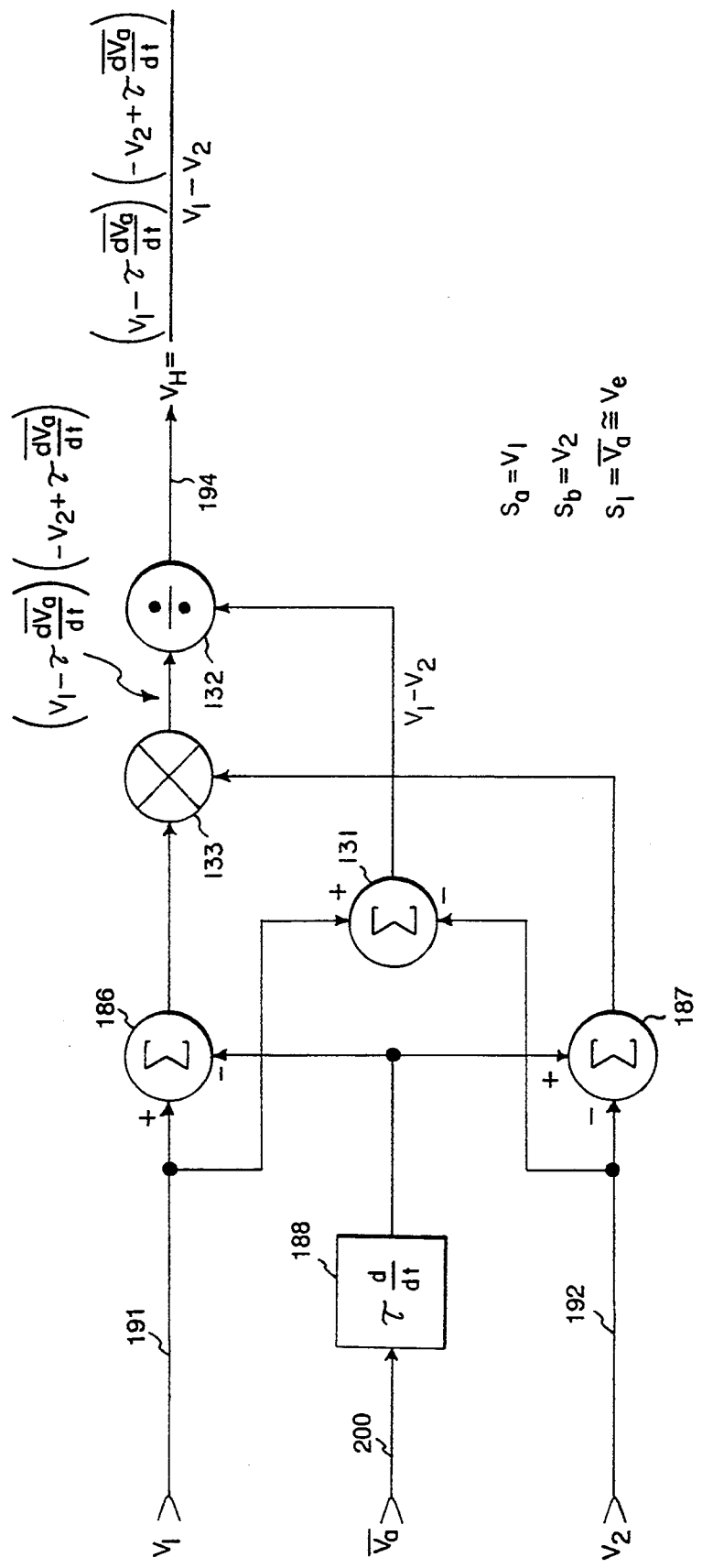
FIG. 17 is s block diagram illustrating the logical arrangement of another embodiment for producing the control voltage.

Referring to FIG. 17, there is shown a block diagram illustrating the logical arrangement of still another system for producing the control voltage $v_H$. This system includes combining means 186 and 187 and differentiating means 188 of FIG. 14. This system includes an additional combining means 131 having its + input coupled to line 191 for receiving the signal $v_1$ and its − input connected to line 192 for receiving the signal $v_2$ and providing an output the combined signal $v_1 - v_2$ that is applied to the divisor input of divider 132. The dividend input receives a product signal from the output of multiplier 133 that multiplies the output signal provided by combining means 186 and 187.

The hysteresis control voltage generated as shown in FIGS. 14–17 may be used to stabilize the switching period of the two-state modulation system. Although these embodiments will maintain frequency stability within acceptable limits for many applications, it may be desirable to attain still greater stability.

Figure 18:
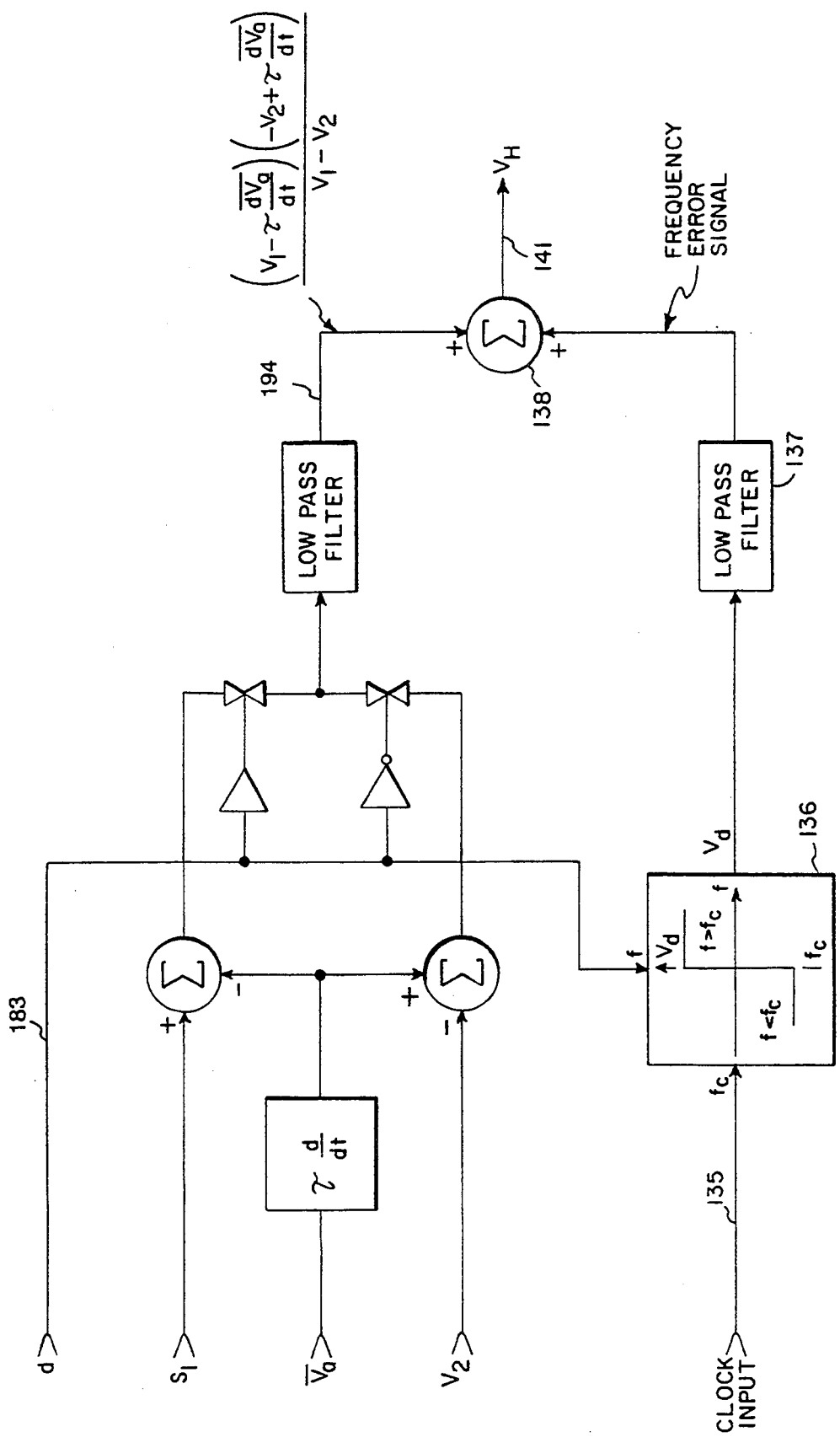
FIG. 18 shows a further embodiment of the invention for providing the control voltage incorporated frequency locking feedback.

Referring to FIG. 18, there is shown still another embodiment of the invention for providing the control voltage $v_H$ incorporating frequency locking feedback. This embodiment incorporates the system of FIG. 14 to effectively compare the instantaneous switching frequency of the two-state modulation system available of line 183 with a reference or clock signal on line 135. A frequency comparator element 136 compares the signal of frequency f on line 183 with the clock signal of frequency $f_c$ on line 135 to provide a signal $v_d$ at the output representative of this difference that is applied to low pass filter 137 to provide a signal to combining means 138 that is combined with the signal on line 194 to provide an output signal $v_H$ on line 141 that maintains the frequency constant. While it is preferred to use both inputs to combining means 138, either input may be used for providing the voltage $v_H$.

The duty cycle of switching within a two-state modulation system is dependent upon the signals applied to the system. It is always possible to apply signals to the system which cause duty cycles to occur at 100% or conversely, near 0%. Since time delays are inevitably present in any practical two-state modulation system, these limiting duty-cycle conditions always lead to operation at frequency away from the normal frequency range for switching. Such loss of frequency control occurs at limiting duty cycles that tend to occur at input signal extremes. One approach for preventing the loss of frequency control is to bound, or prelimit, the input signal.

Referring to FIG. 19, there is shown a block diagram illustrating the logical arrangement of a preferred form of limiter. While it is possible to limit the input signal at fixed levels sufficiently low to avoid overloading under any condition, it is preferred to have the limiting levels track supply level conditions. Limiter 142 receives an input signal on line 143 and provides an output signal on line 144 that does not exceed a limiting level $v_{S1}/K$ and a negative limit level $v_{S2}/K$, typically the supply voltages $S_4$ and $S_5$ applied to the output processing stage.

Referring to FIG. 20, there is shown a block diagram illustrating the logical arrangement of another technique for controlling high level signal conditions in an input signal applied to the two-state modulation system. An input compressor is used to prevent saturation level of this amplifier is proportional to the available supply voltage. An integrating function is provided by the amplifier 232 with inputs at Pins 2 and 3 and output at Pin 1.

Internally generated, variable hysteresis is used to stabilize the switching frequency. A piecewise linear circuit 235 provides the stabilization function which approximately maintains a constant switching frequency. The stabilization function is generated based upon the supply voltage and the input signal.

The spectrum spreading function shown as an additional control circuit 234 connected to Pin 10 is used to avoid narrow band spectral emissions which would be caused if the switching frequency is exactly constant. This function provides a slight amount of frequency modulation in the switching frequency in order to avoid the narrow band conditions.

The frequency stabilization circuit 235 and the spectrum spreading circuit 234 provide output signals which are multiplied together to yield a signal of the form:

$$\frac{(v_s - Gv_i)(v_s + Gv_i)(1 + v_d)}{v_s}$$

where G=constant, and $(1 + v_d)$ is the signal produced by the spectrum spreading circuit.

This signal is applied to ±1 multiplier 239 producing a hysteretic behavior at the input of comparator 233. This sign corresponds to the polarity at the two-state output.

Additional circuits included in integrated circuit 230 are: mute and short-circuit protection circuits 237, power transistor drive circuits 236, and internal 5 vdc and 10 vdc regulator circuits 238.

Figure 24:
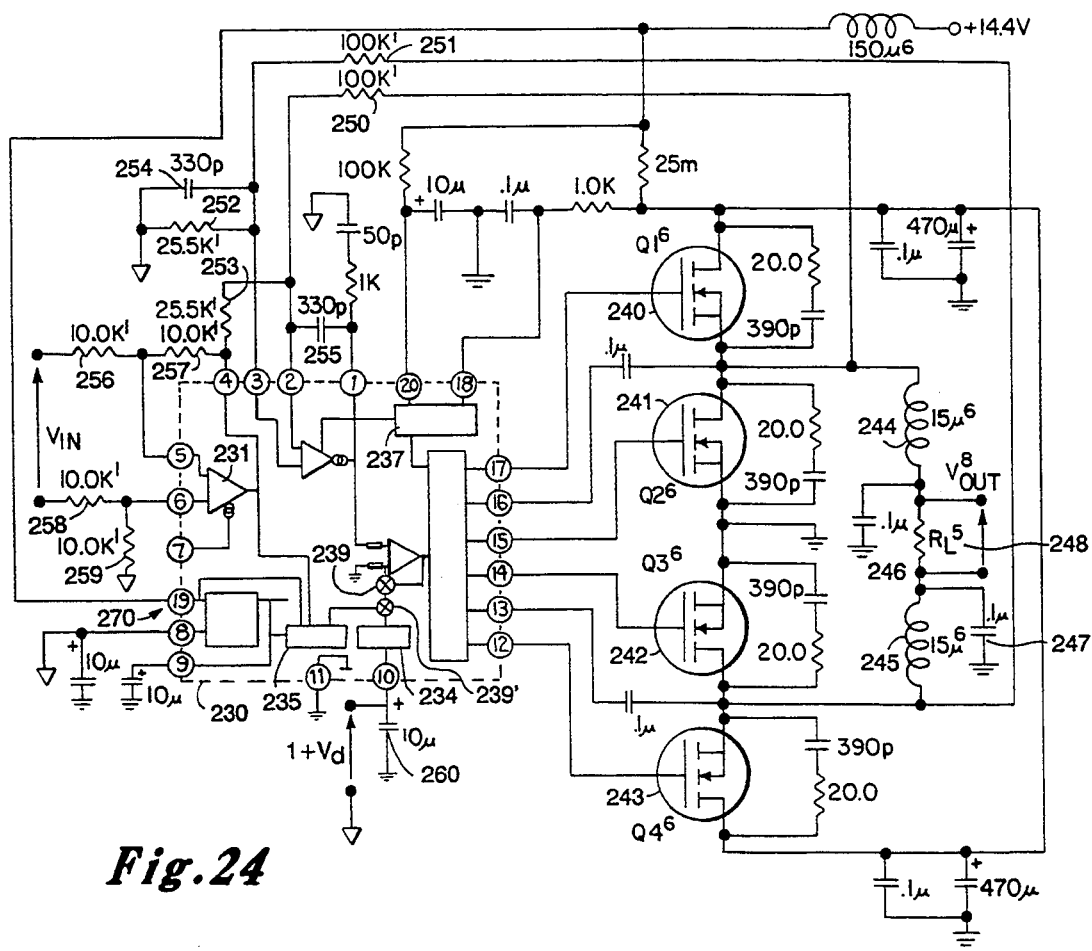
FIG. 24 is a schematic circuit diagram an amplifier using frequency-stabilized two-state modulation implemented with the integrated circuit of FIG. 23.

FIG. 24 shows the L472 integrated circuit 230 connected into a circuit to achieve a complete amplifier function. This is a low voltage amplifier operating from a single 14.4 vdc supply. Consequently, two half-bridge outputs, comprised of transistors 240, 241 and transistors 242, 243, are used to produce a bridge output circuit. Transistors 240 and 243 are switched with a common phase. Transistors 241 and 242 are switched with a common phase which is the inverse of the phase of transistors 240 and 243. The LC output filter, inductors 244, 245 and capacitors 247, 248, attenuate high frequency switching signals so that the load, typically a loudspeaker, receives an audio signal proportional to the input voltage, $v_i$. Voltages are fed back and summed at the input to the integrator by resistors 250-253, and integration is controlled by capacitors 254, 255. The signal, $v_i$, provided at terminal 4 of integrated circuit 230 is limited in amplitude by the limiting amplifier 231. The gain of the limiting amplifier 231 is configured to be unity by the 10.0K ohm resistor network 256-259. The limiting level of amplifier 231 is proportional to the dc supply voltage, $v_s$, applied to pin 19.

Frequency stabilization is accomplished without the use of external components. However, the frequency spectrum produced by the two-state amplifier is spread by maintaining a small frequency modulation, "dither," of the switching frequency. In the circuit of FIG. 24, the switching frequency is frequency modulated between 90 KHz and 110 KHz. The modulation frequency is approximately 10 MHz, and the modulation wave shape is a triangular wave. Capacitor 260 determines the "dither" frequency. The triangular "dither" wave shape is determined by circuits within integrated circuit 230.

Figure 25:
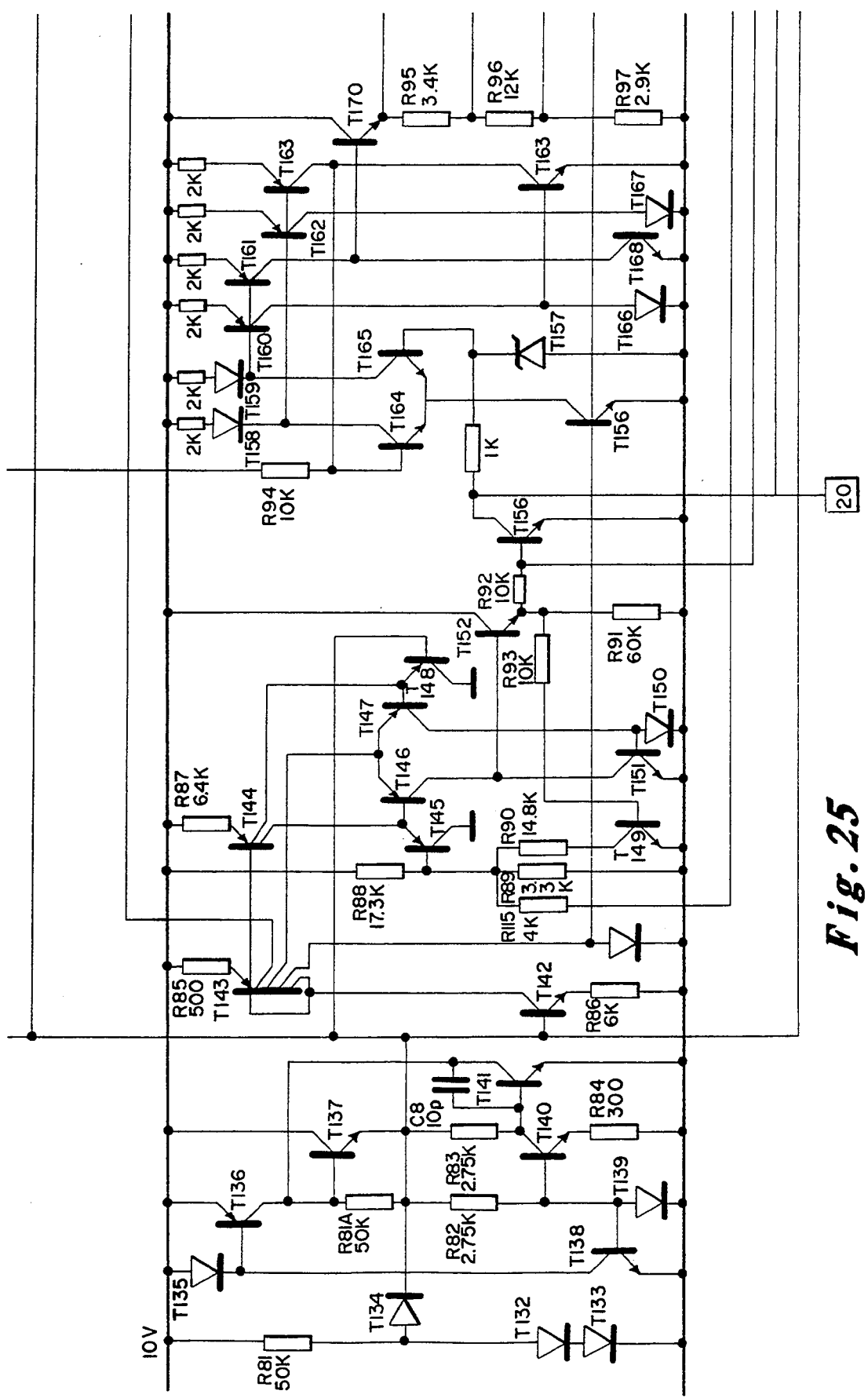
FIGS. 25 and 26 are schematic circuit diagrams of embodiments of the invention.
Figure 25:
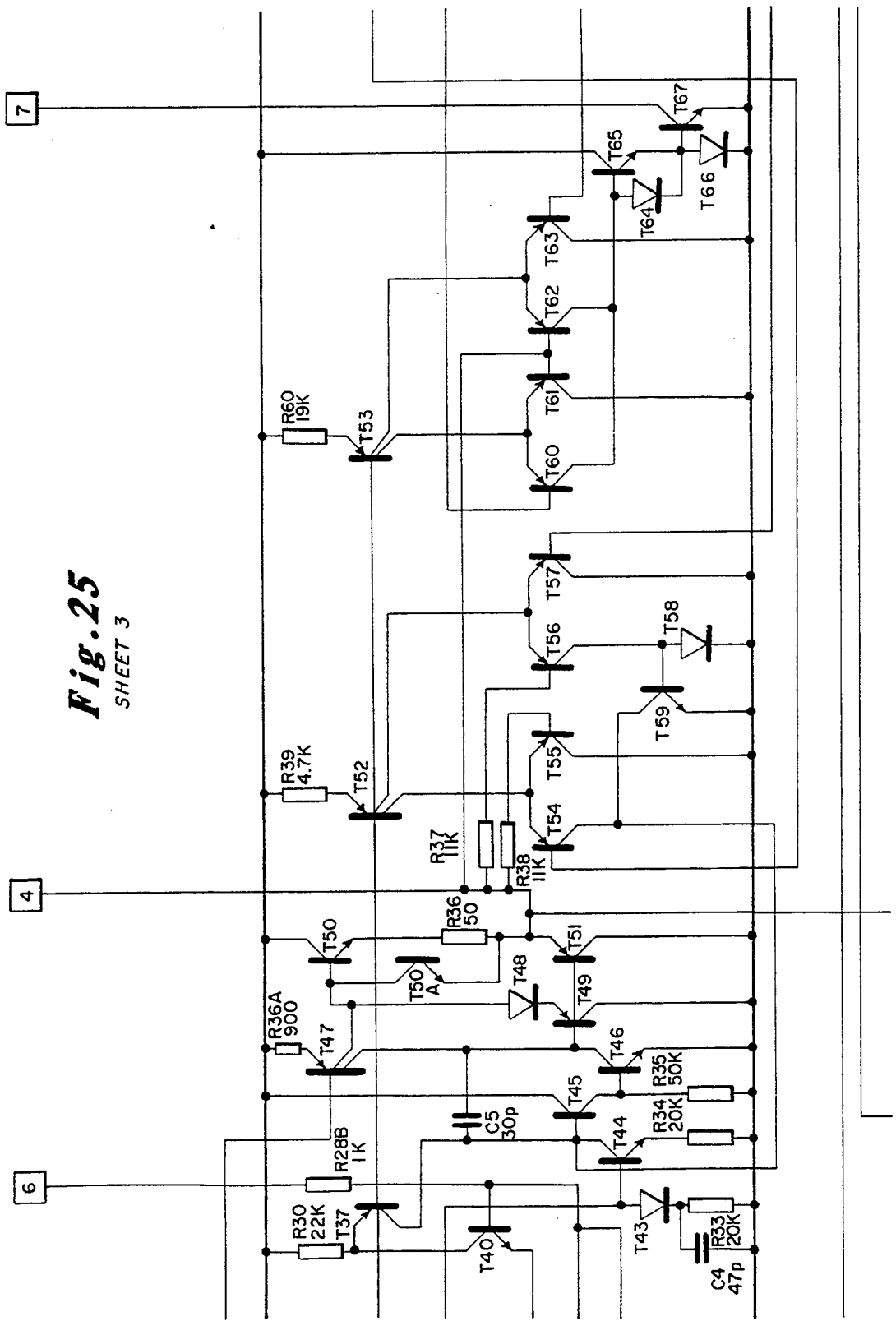
Figure 25:
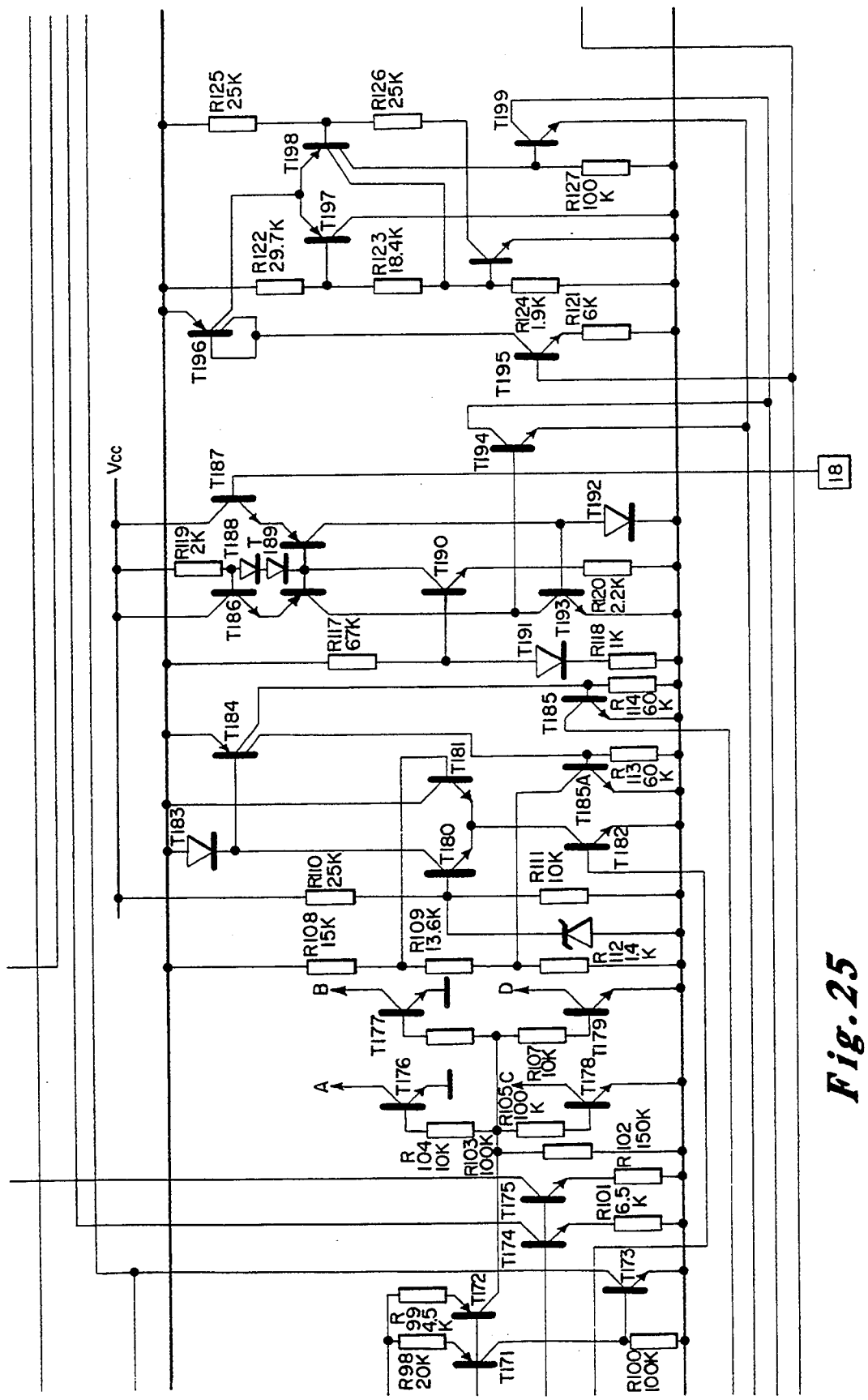
Figure 25:
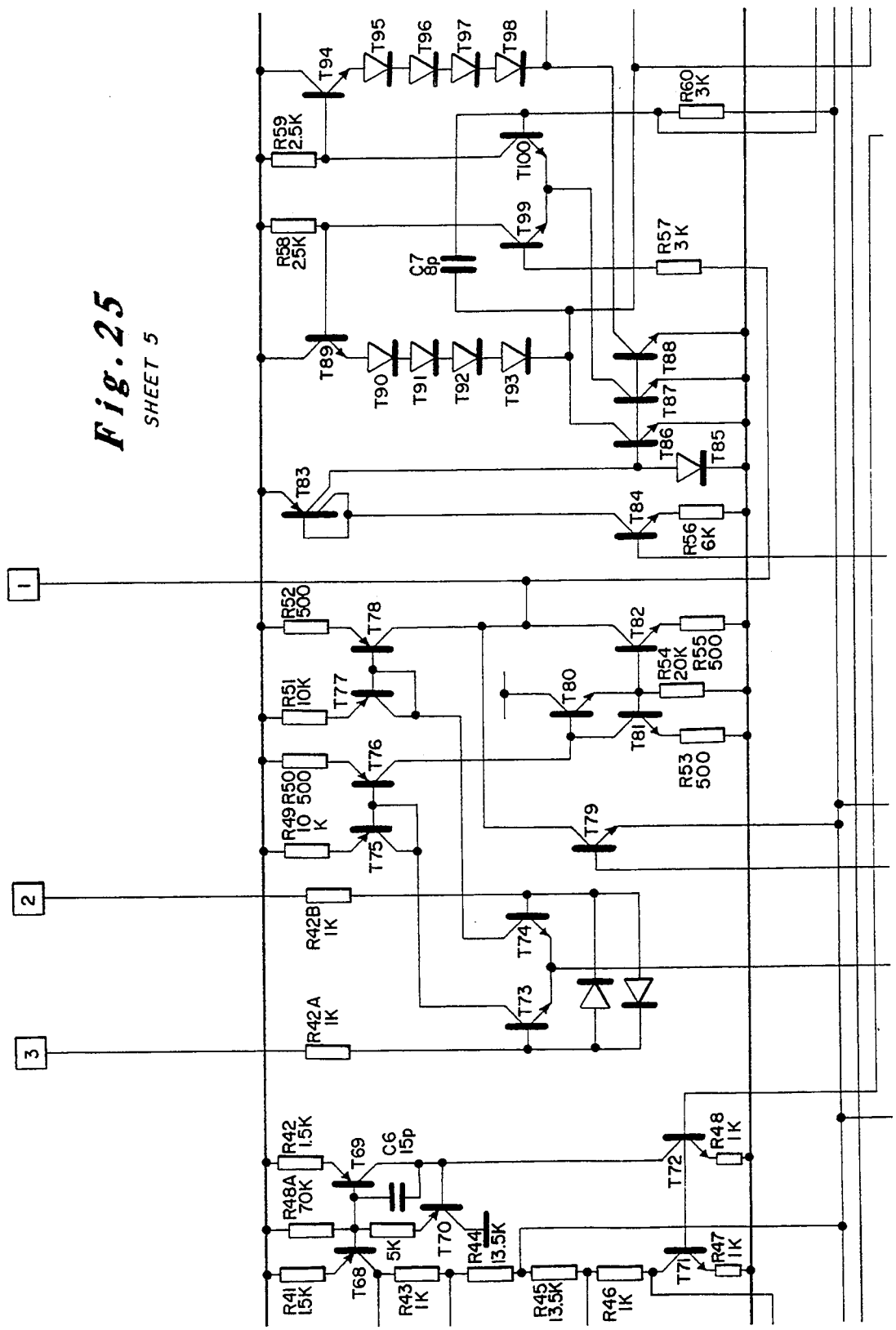
Figure 25:
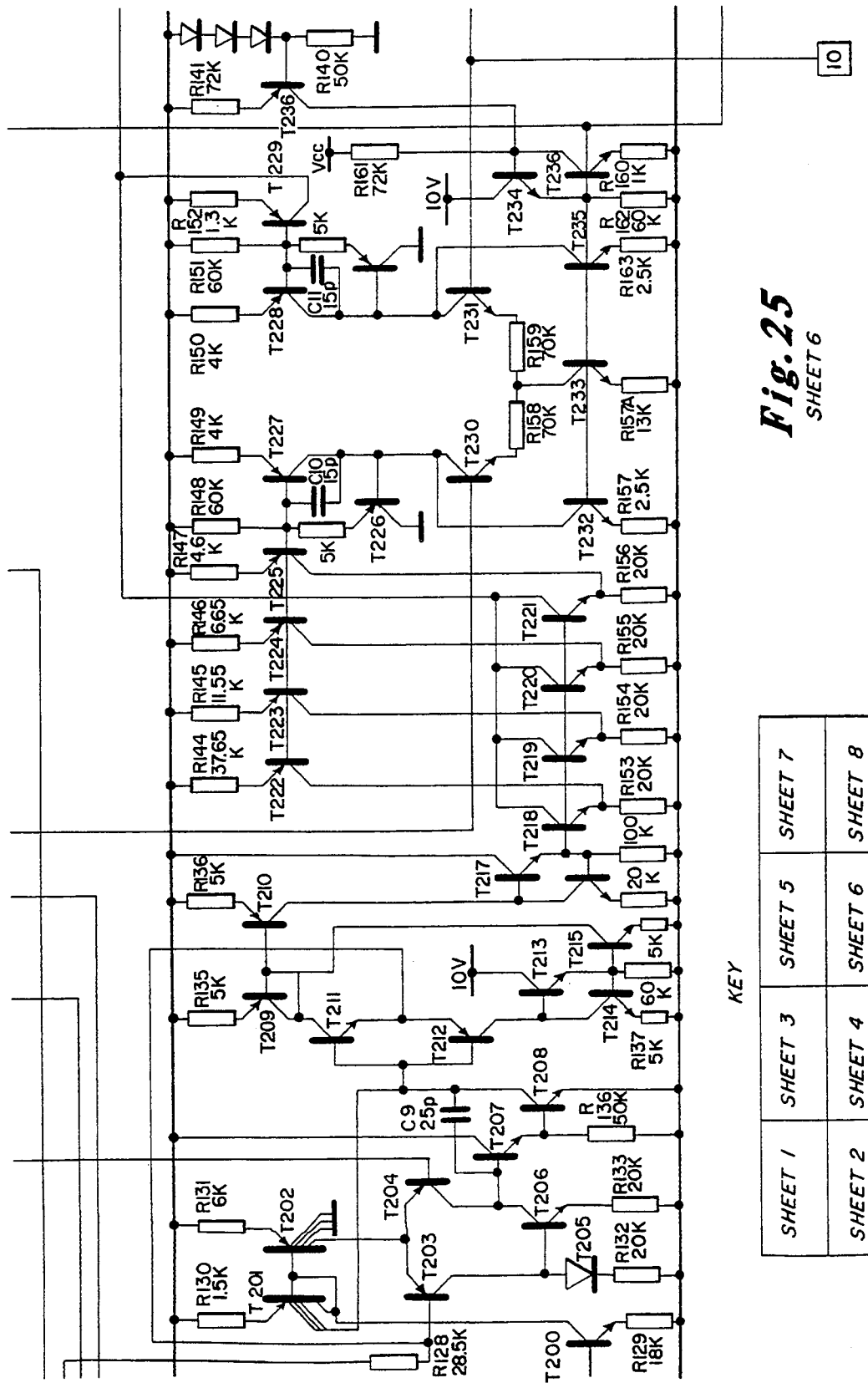
Figure 25:
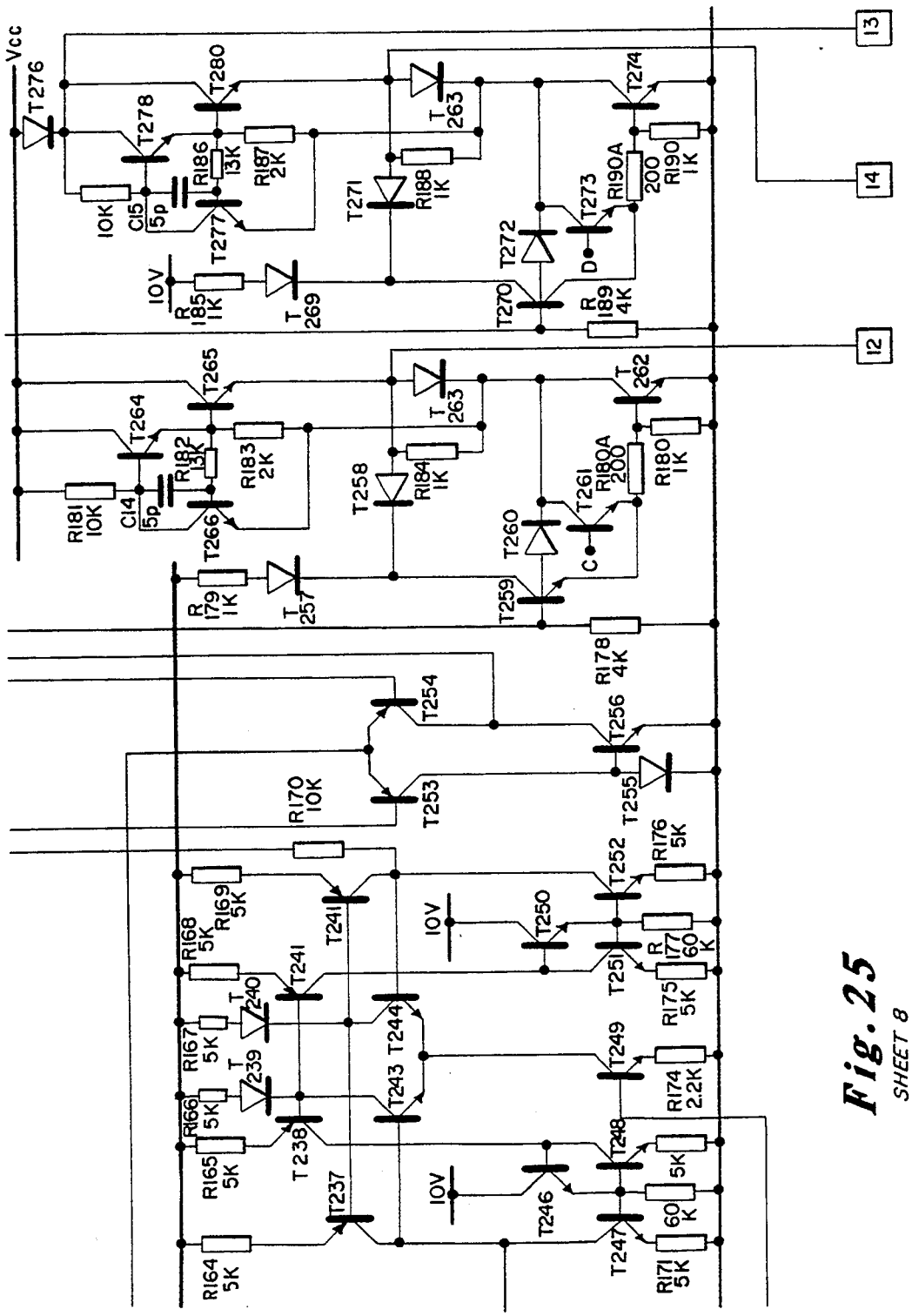

A schematic diagram, FIG. 25, shows the circuits internal to integrated circuit 230. Table 2 identifies the transistors and diodes associated with the elements of the block diagram of integrated circuit 230 shown in FIG. 23.

TABLE 2

| Element of I.C. 230 | Transistors and Diodes in FIG. 25 |
|---|---|
| Limiting Amplifier 231 | T33-T72 |
| Integrating Amplifier 232 | T73-T82 |
| Comparator 233 | T83-T106 |
| Multiplier 239 | T253-T256 |
| Frequency Stabilization Circuit 235 | T200-T236 |
| Spectrum Spreading Circuit 234 | T237-T252 |
| Drive Circuits 236 | T107-T117 |
|  | T119-T129 |
|  | T257-T266 |
|  | T269-T280 |
| 5 vdc & 10 vdc Regulators 238 | T1-T32 |
| Mute & Short-Circuit Protection 237 | T132-T199 — |

While to the best of our knowledge the piecewise linear approach used in the L472 to provide frequency stabilized operation of the two-state modulation process has not been used previously, the concepts involved in achieving this approach are not considered to be new. However, the piecewise linear function combined with the prelimiting function in a single system realization may be novel.

Figure 26:
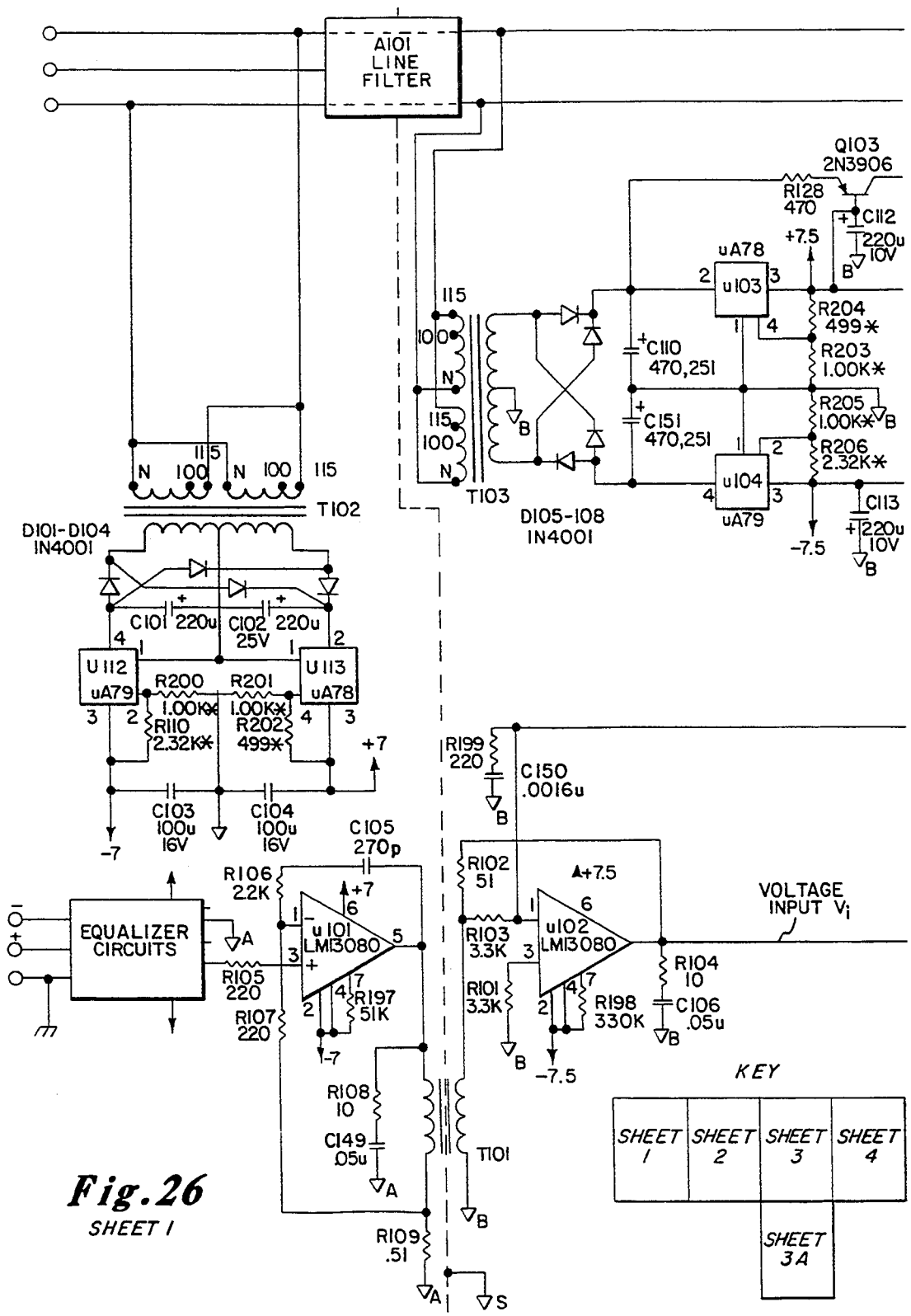
Figure 26:
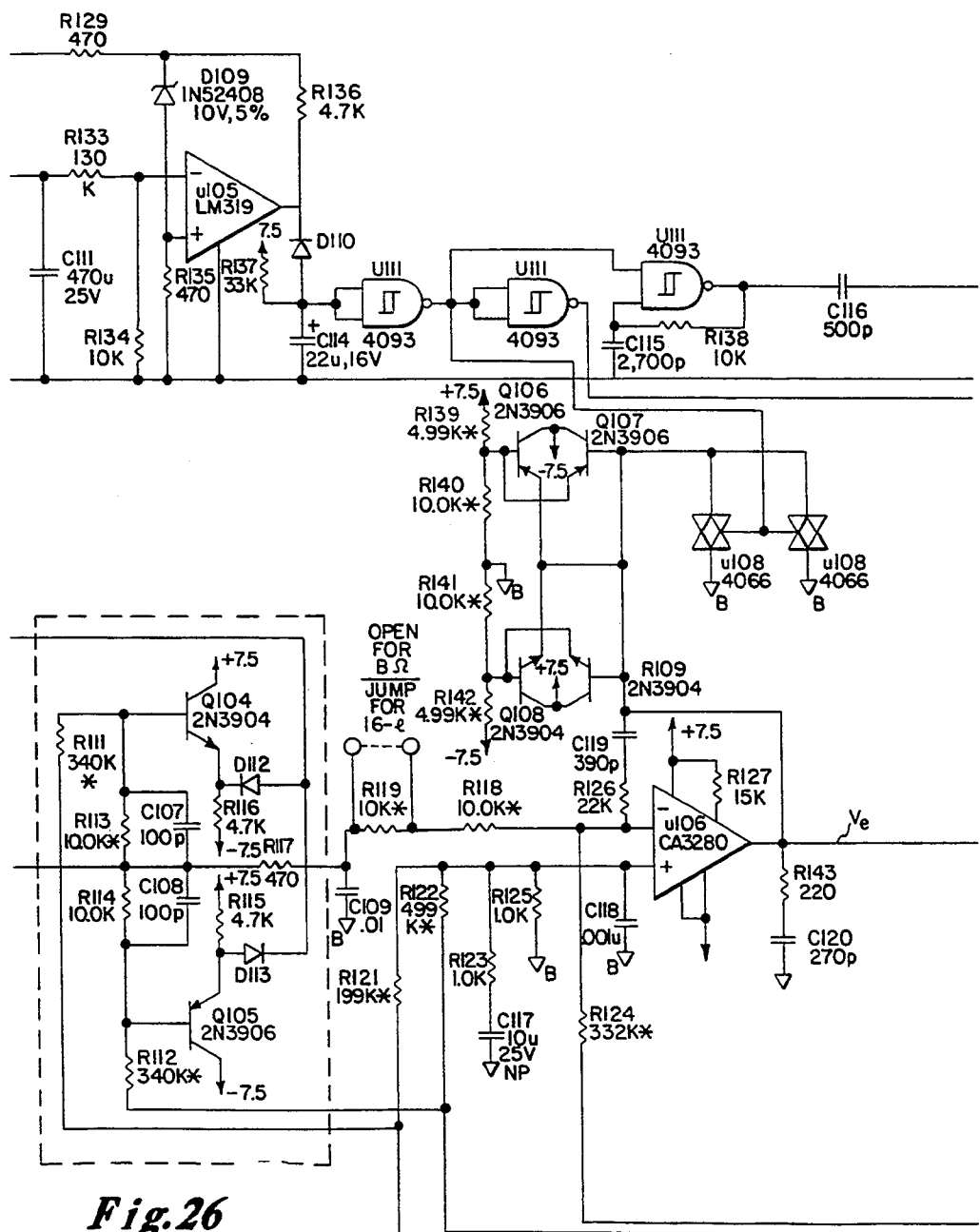
Figure 26:
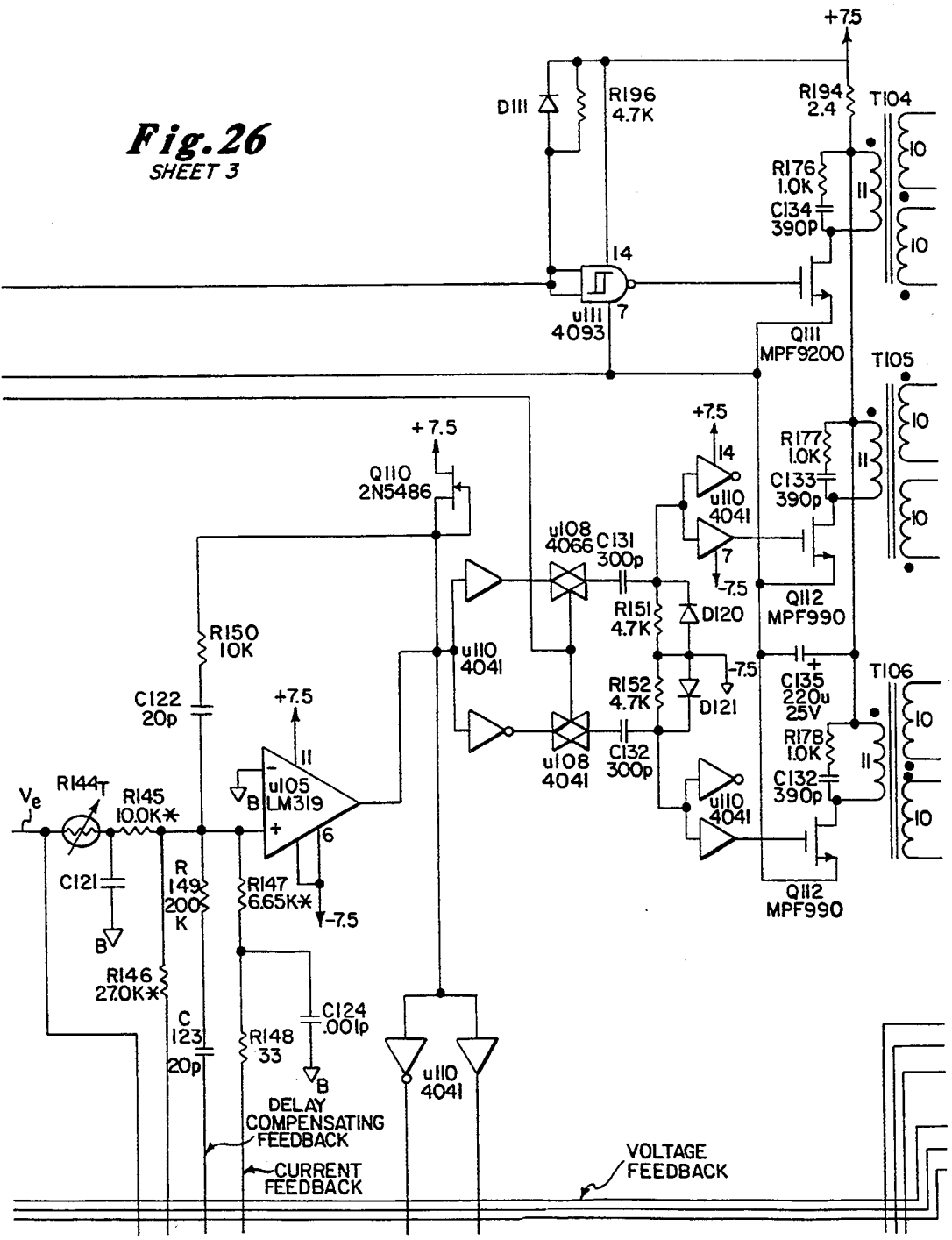
Figure 26:
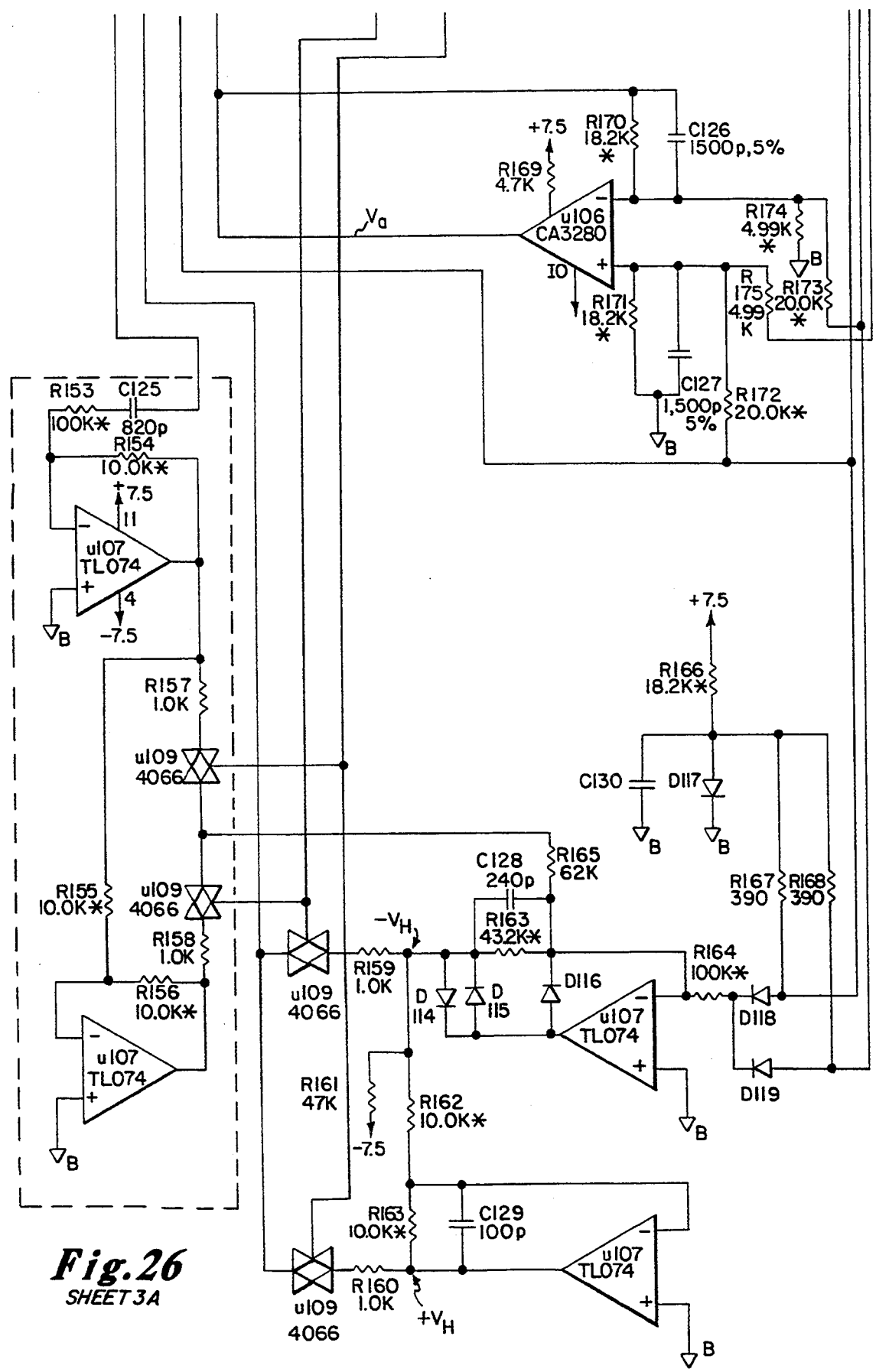
Figure 26:
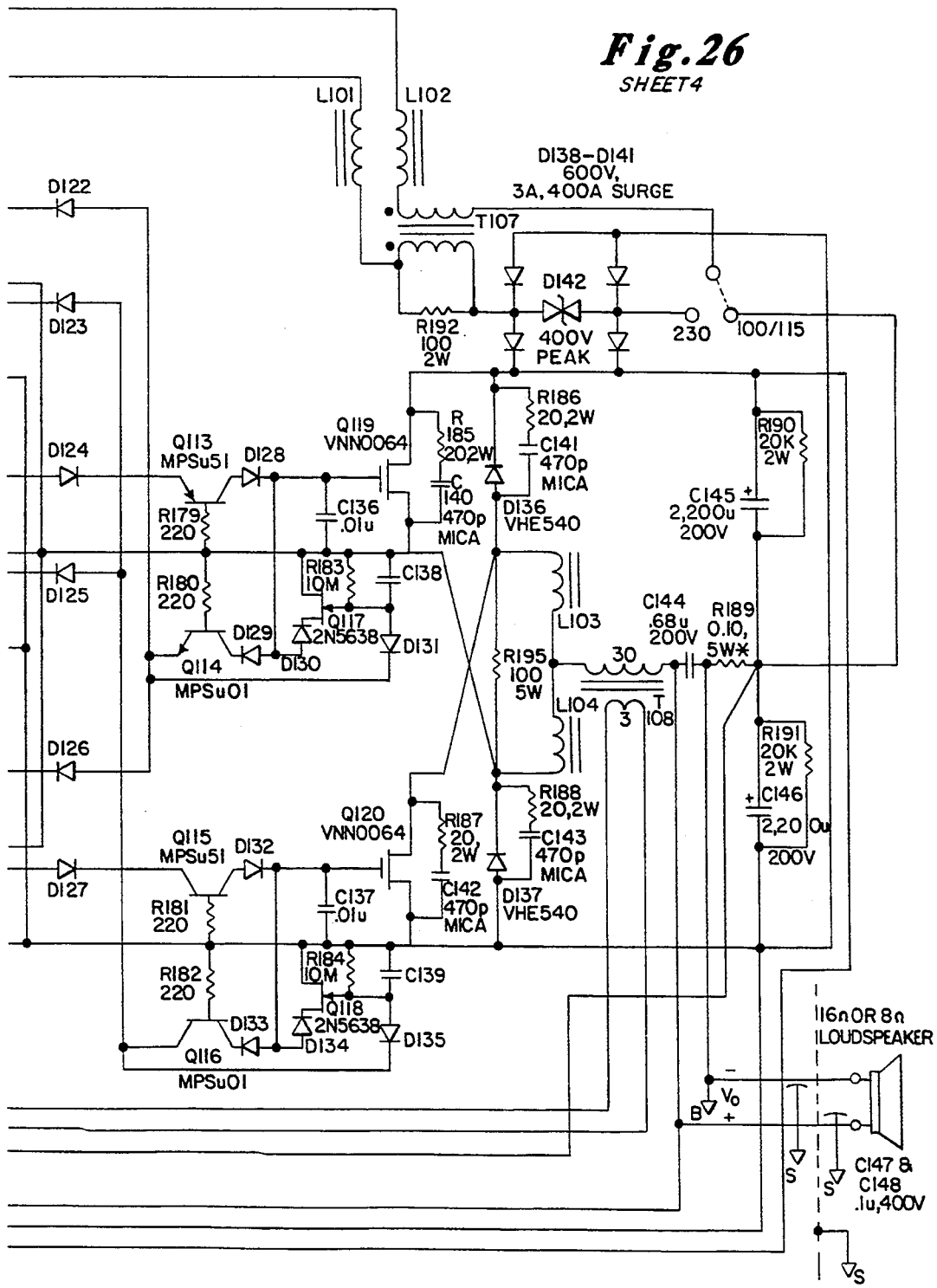

FIG. 26 shows a 450-watt amplifier in accordance with the system approach of FIG. 11. Integrated signal feedback is related to the current flow through filter inductor T108. Output signal feedback is derived from the output voltage applied to the loudspeaker.

The hysteresis control voltage is obtained by rectification of the signal voltage on T108 using the method illustrated in FIG. 16. of the two-state modulation system. This compressor system may comprise an analog multiplier 145 that receives an input signal on line 146 that is multiplied by a signal provided by low pass filter 147 representative of the two-state system switching frequency. Low frequency detector 151 receives a signal on line 184 representative of the switching frequency to provide a representative signal that is applied to low pass filter 147 to provide a multiplier signal that is proportional to switching frequency.

Figure 21:
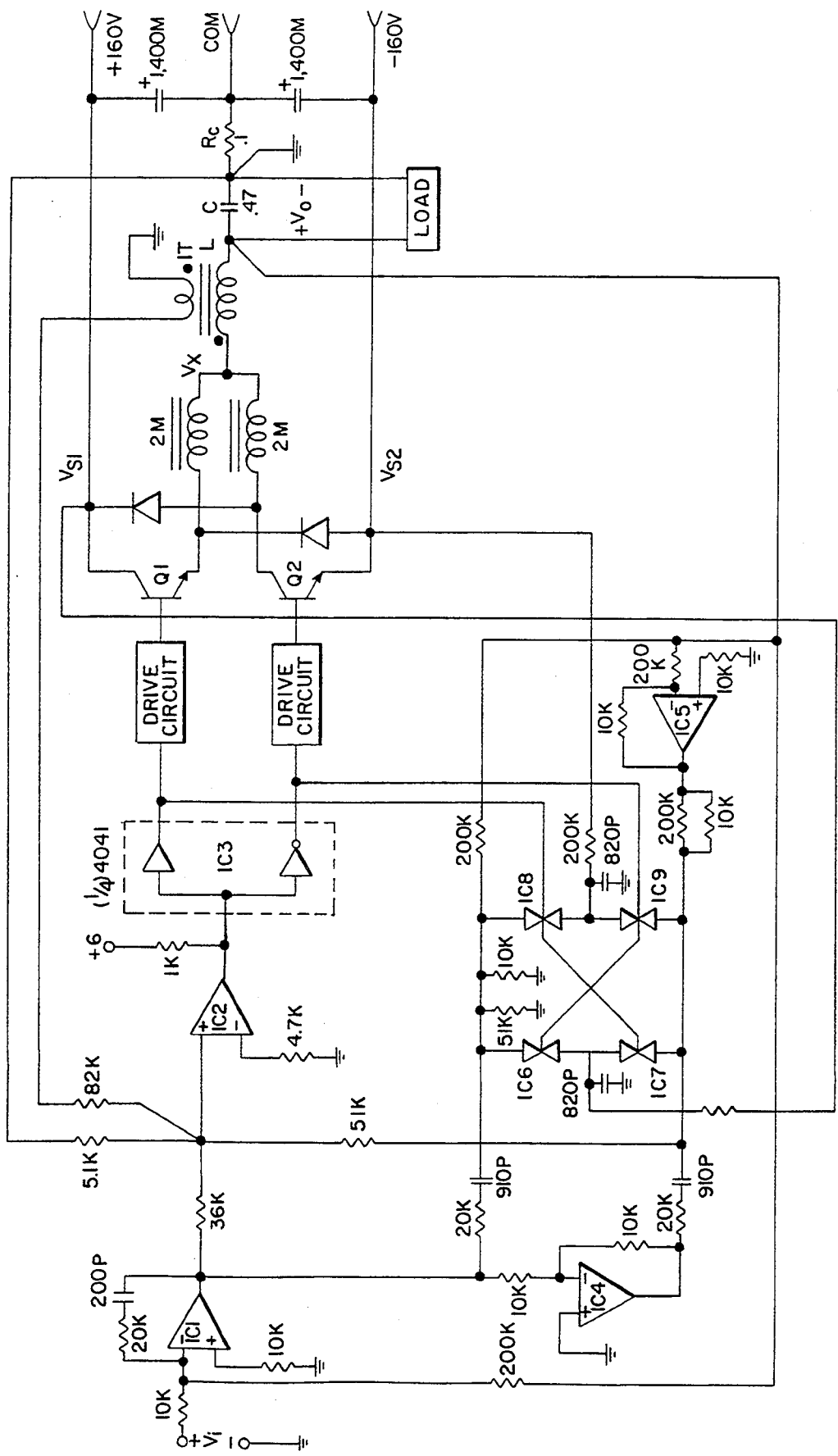
FIGS. 21 and 22 show schematic circuit diagrams of exemplary embodiments of current-control led two-state modulated amplifiers according to the invention with representative parameter values.
Figure 22:
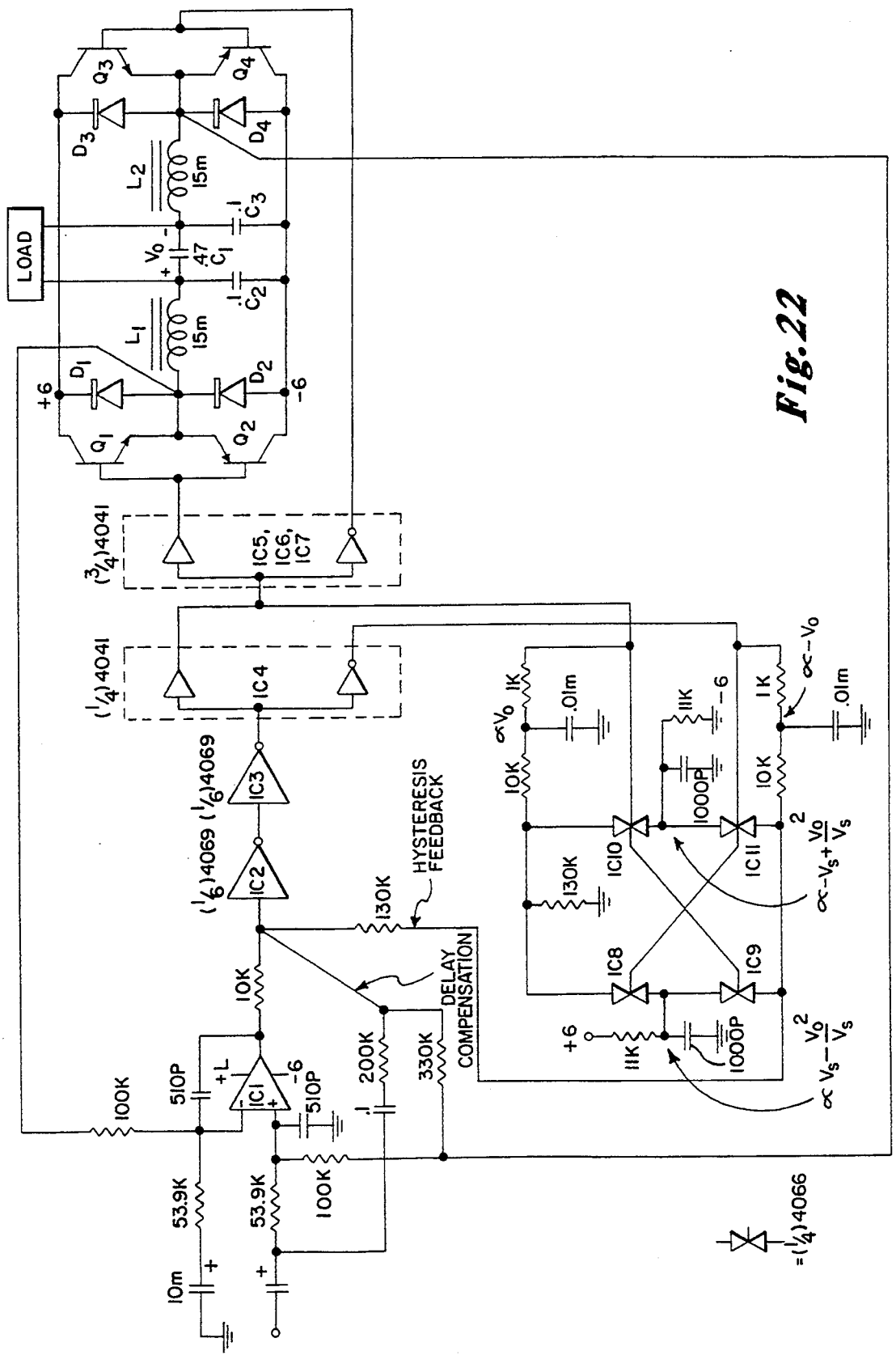

Referring to FIGS. 21 and 22, there is shown a schematic circuit diagrams of exemplary embodiments of current-controlled two-state modulated amplifiers according to the invention with representative parameter values. Since those skilled in the art will be able to build a working model of the invention from this schematic circuit diagram, especially in the light of the principles of operation described above, the schematic circuit diagrams will only be discussed briefly.

Figure 23:
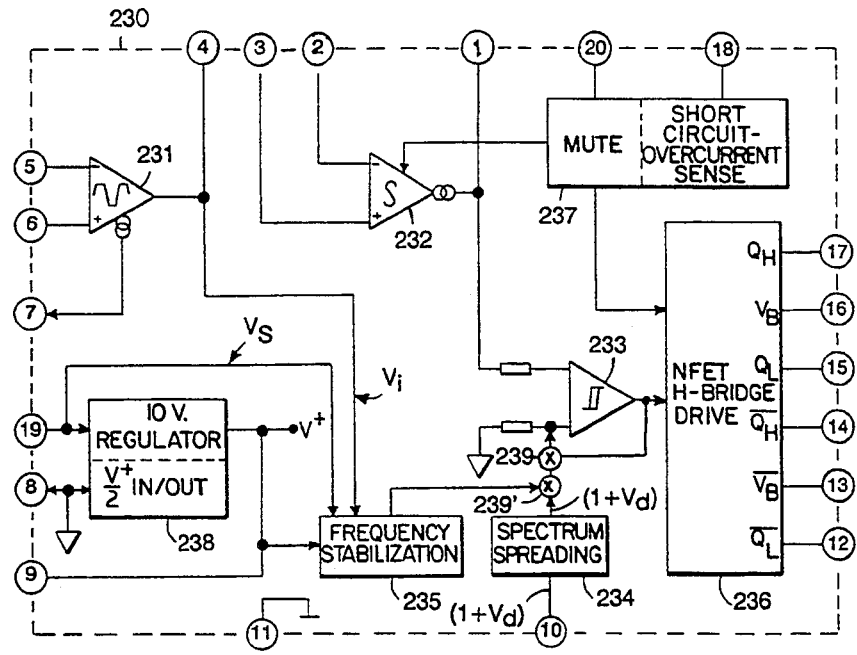
FIG. 23 is a block diagram of an integrated circuit for implementing stabilized frequency two-state modulation according to the invention.

In FIG. 22 switches IC6, IC7, IC8 and IC9 produce the desired variable amplitude hysteresis feedback signal. In FIG. 23 switches IC8, IC9, IC10 and IC11 produce hysteresis feedback signal $v_H$. A signal proportional to the output voltage, $v_o$, is obtained by low pass filtering the two-state signal existing at the output of integrated circuit IC4. While convenient and sufficiently accurate for most purposes, a more accurate approach resides in deriving the signals from the input and from the two-state output signal s at transistor Q1-Q4.

FIG. 23 shows the block diagram of an integrated circuit 230, L472, which is used to realize stabilized frequency operation in accordance with the principles embodied in the block diagram of FIG. 10. The limiting amplifier 231 which prevents overload of the modulation process is connected to Pins 5 and 6 for input signal. The output of the limiting amplifier is provided at Pin 4. The limiting Rate compensation is developed by differentiating the error signal using C125 and R153.

Prelimiting of the input signal prevents overloading. Transistors Q104 and Q105 provide the prelimiting function proportional to the available supply voltage.

Since current feedback is used, current limiting can be provided by limiting the error signal developed at resistor R144. Limiting the error signal absolutely limits the current levels which can be achieved in the power stage so that the amplified can work into short circuits or overloads with safe current levels.

The invention has a number of advantages. Relatively stable frequency may be obtained for a wide range of operating conditions to help avoid overloading. Very precise frequency control may be obtained where desired. Maintaining frequency stability helps facilitate reducing undesired radio frequency interference.

There has been described novel apparatus and techniques for improving a two-state modulation system. It is evident that those skilled in the art may now make numerous uses and modifications of and departures from the specific apparatus and techniques disclosed herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. An amplifier comprising,
   a two-state modulation system having an input terminal for receiving a signal to be amplified, an output terminal, closed loop means comprising apparatus for intercoupling said input terminal and said output terminal and having a two-state power processor for providing first and second signal amplitudes to said output terminal at a switching frequency corresponding to that of a driving signal provided by hysteretic means for providing said driving signal in response to a switching signal provided by first means for combining and related to the signal on said input terminal combined with a feedback signal coupled from said two-state power processor, said hysteretic means being characterized by a hysteresis loop representing the relationship between the input and output of said hysteretic means, hysteretic comparator means including said hysteretic means having first and second variable threshold levels $d_1$ and $d_2$ for switching in response to said switching signal, a source of a hysteresis control signal, means for coupling said source of a hysteresis control signal to said hysteretic means to establish said first and second variable threshold levels and control said hysteresis loop to maintain said switching frequency substantially constant in the presence of variations in the ratio of time the output signal is said first amplitude relative to time said output signal is said second amplitude which ratio is representative of the signal on said input terminal, an averaging circuit having an input coupled to said output terminal and a signal output for providing as an output signal the signal on said input terminal amplified, a source of a dither signal for dithering the frequency of said switching signal, and means for coupling said dither signal to said hysteretic means as at least a component of said hysteresis control signal.

2. In a two-state modulation system having an input terminal, an output terminal, closed loop means comprising apparatus for intercoupling said input terminal and said output terminal and having a two-state power processor for providing first and second signal amplitudes to said output terminal at a switching frequency corresponding to that of a driving signal provided by hysteretic means for providing said driving signal in response to a switching signal provided by first means for combining and related to the signal on said input terminal combined with a feedback signal coupled from said two-state power processor, said hysteretic means being characterized by a hysteresis loop representing the relationship between the input and output of said hysteretic means, the improvement comprising, hysteretic comparator means including said hysteretic means having first and second variable threshold levels $d_1$ and $d_2$ for switching in response to said switching signal, a source of a hysteresis control signal, and means for coupling said source of a hysteresis control signal to said hysteretic means to establish said first and second variable threshold levels and control said hysteresis loop to maintain said switching frequency substantially constant in the presence of variations in the ratio of time the output signal is said first amplitude relative to time said output signal is said second amplitude which ratio is representative of the signal on said input terminal, and further comprising a source of a dither signal for dithering the frequency of said switching signal, and means for coupling said dither signal to said hysteretic means as at least a component of said hysteresis control signal.

* * * * *

UNITED STATES PATENT AND TRADEMARK OFFICE
CERTIFICATE OF CORRECTION

PATENT NO. : 5,345,165
DATED : September 6, 1994
INVENTOR(S) : Thomas A. Froeschle It is certified that error appears in the above-indentified patent and that said Letters Patent is hereby corrected as shown below:

TITLE PAGE

In "References cited" "4,043,890" should read --4,042,890--.

Column 1, line 44, "signal s" should read --signals--.

Column 3, line 2, "current-control led" should read --current-controlled--.

Column 4, line 36, "$\pi$" should read --$\tau$--.

Column 7, line 66, "v$_S$20" should read --v$_S$/2G--.

Column 8, line 1, after "=" should be --(--.

Line 21, "$\tau$h'" should read --$\tau$h-- and the expression after "=" should read --

$$\tau \cdot \frac{v_s^2}{(v_s - Gv_i)(v_s + Gv_i)}$$

--.

Column 8, line 23, before "h" should be --where--.

UNITED STATES PATENT AND TRADEMARK OFFICE
CERTIFICATE OF CORRECTION

PATENT NO. : 5,345,165
DATED : September 6, 1994
INVENTOR(S) : Thomas A. Froeschle It is certified that error appears in the above-indentified patent and that said Letters Patent is hereby corrected as shown below:

Column 8, line 27, the equation should be deleted.

Line 50, "n" should read --h--.

Line 53, the numerator should read --$v_s^2$-- and in the denominator, a bar should appear above "$dv_a$" both occurrences.

Column 9, line 15, in the denominator, a bar should appear above "$dv_a$" both occurrences.

Line 18, before "h" should be --where--.

Line 20 should be deleted.

Line 35, a bar should appear above "$dS_1$".

Line 38, a bar should appear above "$v_a$" and above "$i_L$" and "$=v_e$" should be deleted.

Column 10, line 1, in the numerator after "$S_a$ -" should be --$\tau$--.

UNITED STATES PATENT AND TRADEMARK OFFICE
CERTIFICATE OF CORRECTION

PATENT NO. : 5,345,165
DATED : September 6, 1994
INVENTOR(S) : Thomas A. Froeschle It is certified that error appears in the above-indentified patent and that said Letters Patent is hereby corrected as shown below:

Column 11, line 40, before the fraction should read --$v_H$-- and "vS1" three occurrences should read --$v_{S1}$-- and "vS2" three occurrences should read --$v_{S2}$--.

Column 12, line 1, "state" should read --stage--.

Line 6, "vS1" both occurrences should read --$v_{S1}$--.

Line 13, "vS1" both occurrences should read --$v_{S1}$--.

Line 23, a bar should appear above "$dv_a$".

Line 25, "v1" both occurrences should read --$v_1$--.

Lines 20-34, "vS1" four occurrences should read --$v_{S1}$-- and "vS2" both occurrences should read --$v_{S2}$--.

Line 43, "81" should read --181--.

Line 48, "$S_1$ is FIG. A signal such as" should read --A signal, such as $S_1$ in FIG. 4--.

Column 14, line 22, after "saturation" should read --of the two state modulation system. This compressor system may comprise an analog multiplier 145 that receives an input

UNITED STATES PATENT AND TRADEMARK OFFICE
CERTIFICATE OF CORRECTION

PATENT NO. : 5,345,165
DATED : September 6, 1994
INVENTOR(S) : Thomas A. Froeschle It is certified that error appears in the above-indentified patent and that said Letters Patent is hereby corrected as shown below:

signal on line 146 that is multiplied by a signal provided by low pass filter 147 representative of the two-state system switching frequency. Low frequency detector 151 receives a signal on line 184 representative of the switching frequency to provide a representative signal that is applied to low pass filter 147 to provide a multiplier signal that is proportional to switching frequency.

Referring to FIGS. 21 and 22, there are shown schematic circuit diagrams of exemplary embodiments of current-controlled two-state modulated amplifiers according to the invention with representative parameter values. Since those skilled in the art will be able to build a working model of the invention from this schematic circuit diagram, especially in the light of the principles of operation described above, the schematic circuit diagrams will only be discussed briefly.

UNITED STATES PATENT AND TRADEMARK OFFICE
CERTIFICATE OF CORRECTION

PATENT NO. : 5,345,165
DATED : September 6, 1994
INVENTOR(S) : Thomas A. Froeschle It is certified that error appears in the above-indentified patent and that said Letters Patent is hereby corrected as shown below:

In FIG. 22 switches IC6, IC7, IC8 and IC9 produce the desired variable amplitude hysteresis feedback signal. In FIG. 23 switches IC8, IC9, IC10 and IC11 produce hysteresis feedback signal $v_H$. A signal proportional to the output voltage, $v_o$, is obtained by low pass filtering the two-state signal existing at the output of integrated circuit IC4. While convenient and sufficiently accurate for most purposes, a more accurate approach resides in deriving the signals from the input and from the two-state output signals at transistor Q1-Q4.

FIG. 23 shows the block diagram of an integrated circuit 230, L472, which is used to realize stabilized frequency operation in accordance with the principles embodied in the block diagram of FIG. 10. The limiting amplifier 231 which prevents overload of the modulation process is connected to

UNITED STATES PATENT AND TRADEMARK OFFICE
CERTIFICATE OF CORRECTION

PATENT NO. : 5,345,165
DATED : September 6, 1994
INVENTOR(S) : Thomas A. Froeschle It is certified that error appears in the above-indentified patent and that said Letters Patent is hereby corrected as shown below:

Pins 5 and 6 for input signal. The output of the limiting amplifier is provided at Pin 4. The limiting--.

Signed and Sealed this

Eighteenth Day of February, 1997

Attest:

BRUCE LEHMAN

*Attesting Officer*  *Commissioner of Patents and Trademarks*